United States Patent
Moriya et al.

(10) Patent No.: US 7,651,586 B2
(45) Date of Patent: Jan. 26, 2010

(54) PARTICLE REMOVAL APPARATUS AND METHOD AND PLASMA PROCESSING APPARATUS

(75) Inventors: Tsuyoshi Moriya, Nirasaki (JP); Hiroshi Nagaike, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 837 days.

(21) Appl. No.: 10/920,367

(22) Filed: Aug. 18, 2004

(65) Prior Publication Data

US 2005/0039773 A1    Feb. 24, 2005

(30) Foreign Application Priority Data

Aug. 22, 2003   (JP) .............................. 2003-298440

(51) Int. Cl.
*C23F 1/00*     (2006.01)
*H01L 21/306*   (2006.01)
*C23C 16/00*    (2006.01)

(52) U.S. Cl. .............................. 156/345.47; 118/723 E

(58) Field of Classification Search ................ 118/715, 118/722, 723 R, 723 E; 156/345.43, 345.44, 156/345.45, 345.46, 345.47; 315/111.21, 315/111.31

See application file for complete search history.

(56) References Cited

U.S. PATENT DOCUMENTS

| | | | | |
|---|---|---|---|---|
| 4,826,585 A | * | 5/1989 | Davis | .................... 204/298.37 |
| 4,962,727 A | * | 10/1990 | Harada | .................... 118/723 R |
| 5,269,881 A | * | 12/1993 | Sekiya et al. | ................ 134/1.1 |
| 6,184,489 B1 | * | 2/2001 | Ito et al. | ................ 219/121.43 |
| 6,893,532 B1 | | 5/2005 | Sato | |

FOREIGN PATENT DOCUMENTS

| | | | |
|---|---|---|---|
| JP | 10321604 A | * | 12/1998 |
| JP | 2000-003902 | | 1/2000 |
| JP | 2003-068708 | | 3/2003 |
| JP | 2003-100720 | | 4/2003 |
| WO | WO/0101467 A1 | | 1/2001 |

OTHER PUBLICATIONS

English Machine Translation of Japanese Kokai 10-321604 A to Koga. Obtained on Oct. 16, 2008 from http://www19.ipdl.inpit.go.jp/PA1/cgi-bin/PA1DETAIL.*

* cited by examiner

*Primary Examiner*—Parviz Hassanzadeh
*Assistant Examiner*—Maureen Gramaglia
(74) *Attorney, Agent, or Firm*—Oblon, Spivak, McClelland, Maier & Neustadt, L.L.P.

(57) ABSTRACT

A particle removal apparatus for removing particles from a chamber of a plasma processing apparatus, wherein the chamber is connected to a gas exhaust port and a plasma of a processing gas is generated in the chamber to plasma process a substrate to be processed, includes a particle charging control member for positively charging particles generated within the chamber by positive ions of an ion sheath region formed in a region other than the vicinity of the substrate to be processed, wherein positively charged particles are discharged from the chamber via the gas exhaust port. Therefore, there is no plasma disturbance or metal contamination, and thus can be applied to a practical use.

22 Claims, 15 Drawing Sheets

PARTICLE REMOVAL APPARATUS AND METHOD AND PLASMA PROCESSING APPARATUS

FIELD OF THE INVENTION

The present invention relates to a technology of removing particles in a processing apparatus for performing a film forming processing or a microprocessing; and more particularly, to a method and apparatus of removing particles generated within a plasma processing apparatus.

BACKGROUND OF THE INVENTION

In a fabrication of a semiconductor device or a liquid crystal display, or the like, a substrate to be processed such as a semiconductor substrate, a glass substrate, or the like, is loaded into a processing vessel or a chamber of a processing device, and a film forming processing (chemical vapor deposition, etc.) or a microprocessing of a film (dry etching, etc.) is performed in an airtight or a depressurized chamber, wherein undesired particles are bound to be generated within the chamber. The production of these particles can be caused by the peeling off of reaction products that have been deposited within an inner wall of the chamber, or by growth of reaction products in the chamber, wherein the reaction products are generated by reaction between source gases (processing gases) introduced into the chamber or between a source gas and a material to be etched. These particles generated within the chamber are attached to a surface of the substrate to be processed, thereby causing a reduction in a production yield or deterioration of operating rate of the processing apparatus. Further, the effect of the particles on a process increases as the size of an element forming the semiconductor device or the display device becomes small, since as the size of the element becomes small, even a small particle as well as a large one begins to influence the process.

Conventionally, there have been proposed several kinds of methods for removing reaction products generated within the chamber as particles. Typically, a method for removing particles has been known, in which particles are collected on a negative potential electrode to thereby prevent the particles from falling onto a substrate to be processed, assuming that the particles are positively charged and generated within the chamber when completing a plasma etching (referring to reference 1).

FIG. 16 shows a particle-removing method disclosed in reference 1. A pair of electrodes 202 and 204 for producing a plasma is disposed parallel to each other inside a plasma etching apparatus 200, a lower electrode 202 is electrically connected to a high frequency power source 206 with a cathode coupling arrangement, and an upper electrode 204 is electrically grounded. In a top surface of the lower electrode 202, there is provided an electrostatic chuck electrode 212 of a positive potential via an insulator 210, and a substrate to be processed, e.g., a semiconductor substrate 208, is mounted on the electrostatic chuck electrode 212. A ring-shaped particle-removing electrode 214 is provided between the lower electrode 202 and the upper electrode 204 so as to surround an outer periphery of a plasma generation region. During a plasma etching, a processing gas, e.g., a halogen gas or the like, introduced from a gas inlet port 216 through a shower head 218 is excited into a plasma state between the lower electrode 202 and the upper electrode 204, and becomes a volatile gas by reaction with a material to be etched on a top surface of the semiconductor substrate 208, to thereby be exhausted to the outside of the chamber 200 through an exhaust port 220. The processing gas supply is stopped when the etching is completed, but positively charged particles start to fall off once a high frequency voltage applied being turned off. Accordingly, by applying a negative potential to the particle-removing electrode 214 from a DC power source 230, the positively charged particles are collected on the particle-removing electrode 214 of the negative potential, thereby preventing them from reaching the semiconductor substrate 208.

Another typical method for removing particles of a prior art has been known, in which the particles are negatively charged by a plasma during a plasma processing, and the negatively charged particles in the plasma are removed by a collecting electrode of a positive potential provided in the vicinity of a substrate to be processed (referring to reference 2). FIG. 17 describes the method disclosed in reference 2. Inside a chamber (not shown) of a parallel plate type plasma etching apparatus, there are disposed a lower electrode 300 and an upper electrode 302 parallel to each other, a semiconductor substrate 304 being mounted on the lower electrode 300. Further, a hollow or a tube-shaped collecting electrode 306 is provided in a ring shape around the lower electrode 300 so as to surround the substrate 304. The collecting electrode 306 has openings 307 in an inner peripheral surface thereof, and is connected through an exhaust pump (not shown) to outside the chamber via a gas exhaust path inside a stay 308. Preferably, in the collecting electrode 306, a fine particle attraction electrode (not shown) of a positive potential is provided inside the openings 307. Particles 312 that are negatively charged by a plasma 310 produced between the lower electrode 300 and the upper electrode 302 are collected through the openings 307 inside the collecting electrode 306, and exhausted through the gas exhaust path inside the stay 308 to the outside the chamber. As a result, theses particles 312 are prevented from being attached to the semiconductor substrate 304.

[reference 1] Japanese Patent Laid-Open Application No. 2000-3902 (paragraph [0043], FIG. 11)

[reference 2] WO 01/01467 (pages 9 and 10, FIG. 3)

In the conventional particle-removing method disclosed in reference 1, the positively charged particles are collected on the electrode of the negative potential when the plasma processing is completed, to thereby prevent the particles from being attached to the semiconductor substrate. However, the present inventors examined a behavior of a particle during a plasma processing by way of a particle measurement equipment (FIG. 4) to be mentioned later and found that particles were generated or existed even during the plasma processing, and further, uncharged particles, positively or negatively charged particles existed together (FIG. 7). This phenomenon can be evidently observed in a case of localizing a plasma by a magnetic field or the like, particularly. That is, in such a case, a gap between an inner wall of the chamber or a facing electrode for plasma excitation (for high frequency discharge) and a plasma becomes large, so that particles generated in this region float in an electrically neutral state. However, in the aforementioned prior art, the electrically neutral or negatively charged particles cannot be removed basically.

Further, in the method of reference 1, the particle-removing electrode 214 of the negative potential is disposed in a region where the positively charged particles are generated within the chamber. However, if a jig 214 of a metal member is disposed inside the chamber of the plasma processing apparatus, particularly, in the vicinity of the plasma generation region, a plasma is disturbed, whereby controlling a plasma distribution characteristic becomes difficult. Still further, there is a problem that the metal member may cause a metal contamination. Therefore, it is difficult to apply such a method disclosed in reference 1 to the plasma processing requiring a superior uniformity in a film thickness or an etching rate, or a high credibility of a process.

Meanwhile, in the particle-removing method disclosed in patent reference 2, the negatively charged particles during the plasma processing are removed through the collecting electrode of the positive potential. However, even in this method, uncharged and electrically neutral particles or positively charged particles cannot be removed basically. Further, same as reference 1, the collecting electrode 306 installed in the vicinity of the substrate 304 to be processed significantly disturbs a plasma state, and also, may cause a metal contamination. FIG. 17 shows a main part of the parallel plate type plasma etching apparatus of a cathode coupling mode. However, in a case of an, anode coupling mode in which the lower electrode 300 is connected to a ground potential and the upper electrode 302 is connected to the high frequency power source via capacitance coupling, a plasma is produced more closely to the vicinity of the substrate to be processed 304. Thereby, controlling plasma becomes more difficult due to a disturbance by the collecting electrode 306. Further, if a dimension or an area of the substrate to be processed 304 is large, a distance between the collecting electrode 306 and a central portion of the substrate 304 becomes large. As a result, there is a difficulty in collecting the particles, which fall into the central portion of the substrate. For resolving such a problem, if the collecting electrode 306 is disposed close to the central portion of the substrate, a plasma disturbance becomes serious. Therefore, it is difficult to apply this method to a practical use.

SUMMARY OF THE INVENTION

The present invention is contrived to solve the aforementioned problems. It is, therefore, an object of the present invention to provide a method of removing particles wherein particles generated during a plasma processing can be removed efficiently, there is no plasma disturbance or metal contamination, and thus can be applied to a practical use.

In accordance with one aspect of the present invention, there is provided a particle removal apparatus for removing particles from a chamber of a plasma processing apparatus, wherein the chamber is connected to a gas exhaust port and a plasma of a processing gas is generated in the chamber to plasma process a substrate to be processed, the particle removal apparatus including: a particle charging control member for positively charging particles generated within the chamber by positive ions of an ion sheath region formed in a region other than the vicinity of the substrate to be processed, wherein positively charged particles are discharged from the chamber via the gas exhaust port.

In accordance with another aspect of the present invention, there is provided a particle removal apparatus for removing particles from a chamber of a plasma processing apparatus, wherein the chamber is connected to a gas exhaust port and a plasma of a processing gas is generated in the chamber to plasma process a substrate to be processed, the particle removal apparatus including: a particle charging control member for positively charging particles generated within the chamber by positive ions of an ion sheath region formed in a region other than the vicinity of the substrate to be processed; and a charged particle transfer member for transferring positively charged particles towards the gas exhaust port via the ion sheath region.

In the present invention, it is preferred that the particle charging control member has a control electrode installed to face the plasma with the ion sheath region therebetween and a power supply unit supplying the control electrode with a negative potential, or at least one of the particle charging control member and the charged particle transfer member has a control electrode disposed facing the plasma and a power supply unit supplying the control electrode with a negative potential. By such a configuration, the particles generated within the chamber and thermally moving around the chamber can be efficiently charged positively by the positive ions in the ion sheath region of the electrode side facing with the substrate to be processed or an inner wall side of the chamber.

Further, it is preferred that the control electrode is installed, via an insulating film, on a surface of a second high frequency discharge electrode disposed to face a first high frequency discharge electrode on which the substrate to be processed is mounted, or the control electrode is provided in an inner wall surface of the chamber via an insulating film. By doing this, the particle removal apparatus of the present invention does not have a bad influence on the plasma generation and has a simple configuration, so that the apparatus can be applied to a practical use.

Still further, the control electrode may have a plurality of conductors physically separated from each other, and the power supply unit supplies the conductors with independent negative potentials. In this case, it is preferred that the power supply unit supplies a negative potential with a greater absolute value to a conductor disposed closer to the gas exhaust port. By such a configuration, the positively charged particles can be drift transferred towards the gas exhaust port, to thereby be discharged with a high efficiency.

Still further, the power supply unit may supply the conductors with pulses of negative potentials with a phase relationship allowing the positively charged particles to be sequentially transferred towards the gas exhaust port. By doing this, the particles to be collected between the plasma and the control electrode by a repulsive Coulomb force from the plasma PZ having a positive electric potential and an attractive Coulomb force from the control electrode, as mentioned above, can be efficiently transferred from the central portion to the periphery of the chamber. In addition, the particles reaching the inner wall side of the chamber can be delivered to the gas exhaust port with a high efficiency.

Meanwhile, the power supply unit may have a DC power source electrically connected to the control electrode via a DC circuit, or have a high frequency power source electrically connected to the control electrode via capacitance coupling. Further, a surface of the control electrode may be coated with an insulating film. If the surface of the control electrode is coated with the insulating film, there is no metal contamination. Therefore, a plasma processing can be performed with a high credibility.

Further, the plasma processing apparatus of the present invention may have a magnetic field forming member for localizing the plasma produced in the chamber around the substrate to be processed. In this case, a space region facing the substrate to be processed with the plasma therebetween inside the chamber becomes large. By installing the control electrode of the particle charging control member or the particle transfer member in the space region, the plasma is less likely to be disturbed.

In accordance with still another aspect of the present invention, there is provided a method of removing particles from a chamber of a plasma processing apparatus, wherein the chamber is connected to a gas exhaust port and a plasma of a processing gas is generated in the chamber to plasma process a substrate to be processed, the method including the steps of: positively charging particles generated within the chamber by positive ions of an ion sheath region formed in a region other than the vicinity of the substrate to be processed; guiding positively charged particles towards the gas exhaust port via the ion sheath region; and discharging the positively charged particles from the chamber through the gas exhaust port.

In the present invention, it is preferred that a negative potential is applied to a surface of an object disposed adjacent to the ion sheath region in order to attract positive ions and the positively charged particles towards the surface of the object. Further, it is preferred that the object adjacent to the ion sheath region is electrically divided into a plurality of regions depending on a distance from the gas exhaust port, and independent negative potentials are applied to the respective regions. Wherein, a negative potential with a greater absolute value may be applied to a region closer to the gas exhaust port. Still further, a number of negative potentials with different pulse phases may be applied to the plurality of regions, to transfer the positively charged particles towards the gas exhaust port. By doing this, the positively charged particles can be efficiently drift transferred towards the gas exhaust port, and be easily discharged from the chamber. In addition, the attachment of the particles to the substrate to be processed can be suppressed.

Meanwhile, in accordance with a following method of removing particles, negative voltages of periodic pulses, whose phases are deviated from each other, are applied in a plurality of regions forming a control electrode, and positively charged particles are transferred towards a gas exhaust port. By doing this, particles can be very efficiently transferred, particularly, from a central portion to a periphery of the chamber to thereby further improve a removal efficiency of the particles.

In accordance with still another aspect of the present invention, there is provided a method of removing particles from a chamber of a plasma processing apparatus, wherein the chamber is connected to a gas exhaust port and a plasma of a processing gas is generated in the chamber to plasma process a substrate to be processed, the method including the steps of: positively charging particles by positive ions of an ion sheath region formed along an inner wall of the chamber; guiding positively charged particles towards the gas exhaust port along the inner wall of the chamber; and discharging the positively charged particles from the chamber through the gas exhaust port. In such a method of removing particles, it is preferred that a control electrode embedded in an insulator is provided on the inner wall of the chamber, and a negative potential for attracting the positive ion and the positively charged particles toward the inner wall of the chamber is applied to the control electrode.

In accordance with still another aspect of the present invention, there is provided a method of removing particles from a chamber of a plasma processing apparatus, wherein the chamber is connected to a gas exhaust port and a plasma of a processing gas is generated within the chamber by applying a high frequency power between a first and a second electrode disposed in the chamber to face each other to plasma process a substrate to be processed placed on the first electrode, the method including the steps of: positively charging particles by positive ions of an ion sheath region formed along the second electrode; guiding positively charged particles towards the gas exhaust along a main surface of the second electrode and an inner wall of the chamber; and discharging the positively charged particles from the chamber through the gas exhaust port.

In the aforementioned method of removing particles, a control electrode embedded in an insulator may be provided on the main surface of the second electrode and a negative voltage for attracting the positive ions and the positively charged particles towards the main surface of the second electrode may be applied to corresponding control electrode.

Further, in the aforementioned methods of removing particles, the gas exhaust port may be disposed around a lower part of the inner wall of the chamber- and the positively charged particles may be guided towards the gas exhaust port while moving down along the inner wall of the chamber. Otherwise, a baffle plate for providing a gas exhaust path of a low conductance may be installed in the vicinity of an entrance side of the gas exhaust port, and a negative potential is applied to the baffle plate. By doing this, the positively charged particles can be efficiently drift transferred towards the gas exhaust port, to thereby be discharged from the chamber with high speed.

In accordance with still another aspect of the present invention, there is provided a plasma processing apparatus having a chamber connected to a gas exhaust port, wherein a plasma of a processing gas is generated within the chamber to plasma process a substrate to be processed, the plasma processing apparatus including: a particle charging control member for positively charging particles generated within the chamber by positive ions of an ion sheath region formed in a region other than the vicinity of the substrate to be processed, wherein positively charged particles are discharged from the chamber via the gas exhaust port.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 1:
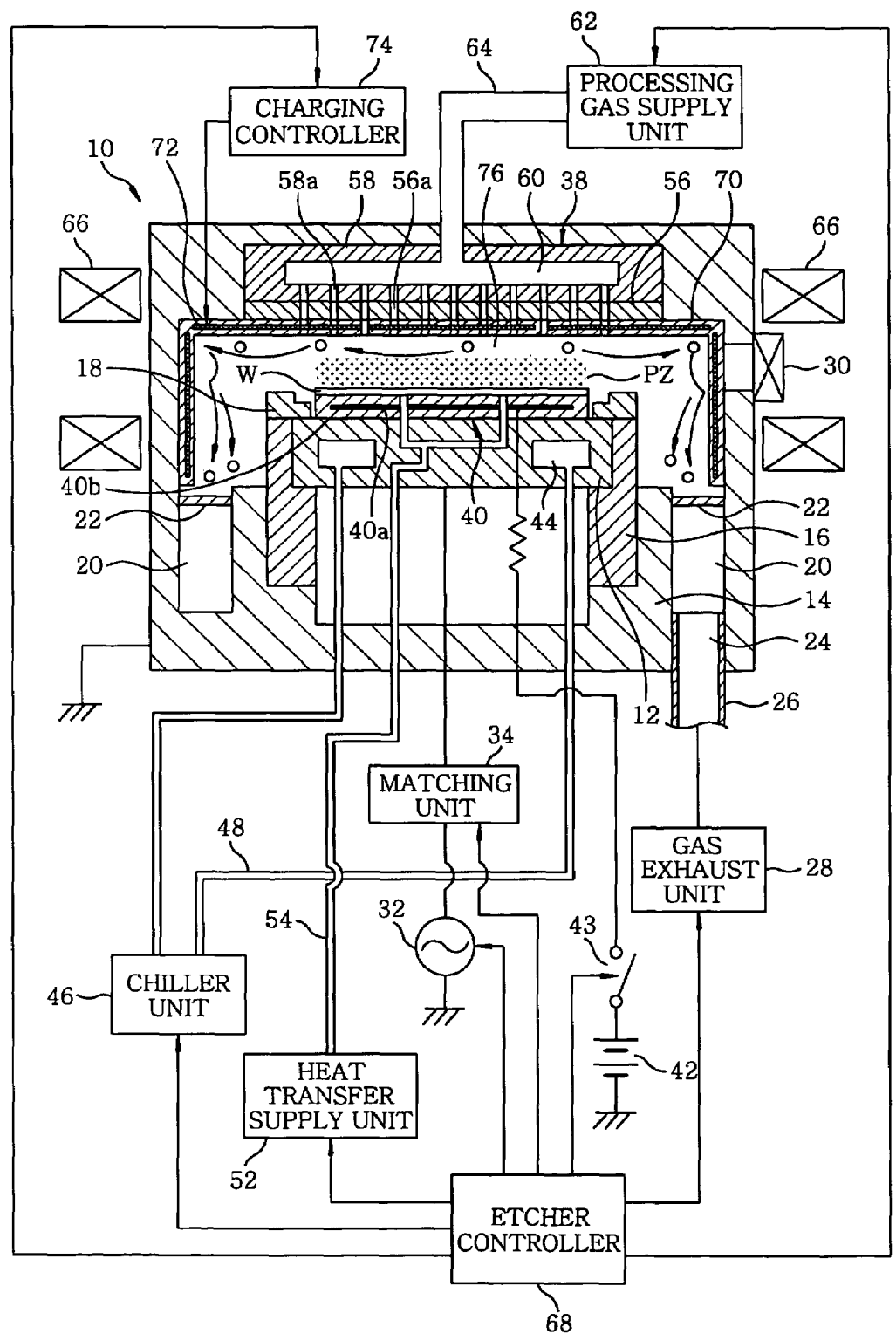
FIG. 1 shows a configuration of a plasma etching apparatus adopting a particle removal apparatus in accordance with a first preferred embodiment of the present invention.

FIG. 1 shows a configuration of a plasma processing apparatus having a particle removal apparatus in accordance with a first preferred embodiment of the present invention. The plasma processing apparatus is a parallel plate type RIE plasma etching apparatus, and has a cylindrical chamber (processing vessel) 10 made of a metal, e.g., aluminum, stainless, or the like. The chamber 10 is frame grounded.

In the chamber 10, there is installed a disk-shaped lower electrode or a susceptor 12 on which a substrate to be processed, e.g., a semiconductor wafer W, is mounted. The susceptor 12 is made of, e.g., aluminum, and supported by a tube-shaped supporter 16, which is vertically extended upward from a bottom of the chamber 10, via an insulating and tube-shaped holder 14. In a top surface of the tube-shaped supporter 16, there is disposed a focus ring 18 made of, e.g., a quartz, and annularly surrounding a top surface of the susceptor 12.

A gas exhaust path 20 is formed between a sidewall of the chamber 10 and the tube-shaped holder 14, and an annular baffle plate 22 is provided in an inlet port or an inside of the gas exhaust path 20 and, at the same time, a gas exhaust port 24 is installed in a bottom portion. A gas exhaust apparatus 28 is connected to the gas exhaust port 24 via the gas exhaust path 26. The gas exhaust apparatus 28 has a vacuum pump, and can depressurize an inside of the chamber 10 up to a predetermined vacuum level. In the sidewall of the chamber 10, there is provided a gate valve 30 for opening/closing a loading/unloading port of the semiconductor wafer W.

A high frequency power source 32 for producing a plasma and RIE is electrically connected to the susceptor 12 via a matching unit 34. The high frequency power source 32 applies a predetermined high frequency, e.g., a high frequency power of 60 MHz, to the lower electrode, i.e., the susceptor 12. In a ceiling of the chamber, there is installed a shower head 38 that will be described later, as an upper electrode of a ground potential. A high frequency voltage from the high frequency power source 32 is applied between the susceptor 12 and the shower head 38.

An electrostatic chuck 40 for holding the semiconductor wafer W by electrostatic adsorptive force is provided in a top surface of the susceptor 12. An electrode 40a made of a conductive film is embedded between a pair of insulating films 40b in upper and lower sides of the electrode 40a, and a DC power source 42 is electrically connected to the electrode 40a via a switch 43. By a DC voltage from the DC power source 42, the semiconductor wafer W can be adsorbed and held on the chuck by Coulomb force.

Inside the susceptor 12, a coolant passageway 44 spreading, e.g., in a circumferential direction is installed. A coolant, e.g., a cooling water, kept at a predetermined temperature is circulated and supplied into the coolant passageway 44 via the lines 48 and 50 from a chiller (cooler) unit 46. Further, a heat transfer gas, e.g., a He gas, from a heat transfer gas supply unit 52 is supplied between the top surface of the electrostatic chuck 40 and a rear surface of the semiconductor wafer W via a gas supply line 54.

The shower head 38 of the ceiling has an electrode plate 56 having a plurality of gas passing holes 56a, in a lower surface thereof, and an electrode supporting body 58 for supporting the electrode plate 56 such that the electrode 56 can be attached thereto or detached therefrom. Here, the electrode supporting body 58 has a plurality of gas passing holes 58a connected with the gas passing holes 56a of the electrode plate 56. A buffer chamber 60 is installed inside the electrode supporting body 58, and a gas supply line 64 from a processing gas supply unit 62 is connected to a gas inlet port of the buffer chamber 60.

An annularly or concentrically spreading magnet 66 is disposed around the chamber 10. Inside the chamber 10, an RF electric field is formed in a vertical direction by the high frequency power source 32 in a space between the shower head 38 and the susceptor 12. By high frequency discharge, it is possible to produce a plasma of high density in the vicinity of a surface of the susceptor 12.

An etcher controller 68 functions to control an operation of each unit inside the plasma etching apparatus such as a gas exhaust unit 28, the high frequency power source 32, the switch 43 for electrostatic chuck, the chiller (cooler) unit 46, the heat transfer gas supply unit 52, the processing gas supply unit 62, a control unit of the particle removal apparatus (e.g., charging controller 74) that will be described later, and the like, and is connected to an external apparatus, e.g., a host computer (not shown).

In this plasma etching apparatus, an etching is performed in such a manner that first, a gate valve 30 is opened, and a semiconductor wafer W as an object to be processed is loaded into the chamber 10 and mounted onto the electrostatic chuck 40. Then, a processing gas, i.e., an etching gas, is introduced into the chamber 10 at a predetermined flow rate from the processing gas supply unit 62, and an inner pressure of the chamber 10 is set at a set value by adjusting the gas exhaust unit 28. Further, a predetermined high frequency power is supplied into the susceptor 12 from the high frequency power source 32. Still further, a DC voltage is applied to the electrode 40a of the electrostatic chuck 40 from the DC power source 42 to adhere the semiconductor wafer W on the electrostatic chuck 40. An etching gas discharged from the shower head 38 is converted into a plasma state by high frequency discharge between the electrodes 12 and 38, and a main surface of the semiconductor wafer W is etched by a radical or an ion generated in the plasma.

The particle removal apparatus in accordance with this embodiment includes a charging electrode 72 equipped in an inner wall of the chamber 10 or the shower head (upper electrode) 38 having a film-shaped insulator 70 therebetween; and a charging controller 74 to control the charging of a particle in the chamber 10 through the charging electrode 72. The charging electrode 72 is made of a film-shaped or a sheet-shaped conductor, e.g., aluminum, stainless steel, or the like. A negative potential from the charging controller 74 is applied to the charging electrode 72. The insulator 70 is made of, e.g., alumina for which a surface of aluminum is alumite treated, or ceramic obtained by thermally spraying yttria ($Y_2O_3$) to a conductor, wherein entire surfaces (inner and outer surfaces) of the charging electrode 72 are coated therewith. Meanwhile, in the inner wall surface of the shower head (upper electrode) 38, openings connected with the gas discharge openings 56a going through the electrode plate 56, the charging electrode 72 and the insulator 70 are installed. Preferably, the charging controller 74 includes a variable output voltage DC power source, and is configured to control a potential of the charging electrode 72 and an application time of a voltage, under the control of the etcher control unit 68.

As described above, in this embodiment, there is installed the charging electrode 72 that is attached or connected to the inner wall of the chamber 10 or the shower head 38 having the film-shaped insulator 70 therebetween. However, it can be configured such that the inner wall of, e.g., aluminum made chamber 10 or the shower head 38 is alumite treated to have a control voltage applied thereto, that is, the chamber 10 or the shower head 38 serves as a charging electrode.

Figure 2:
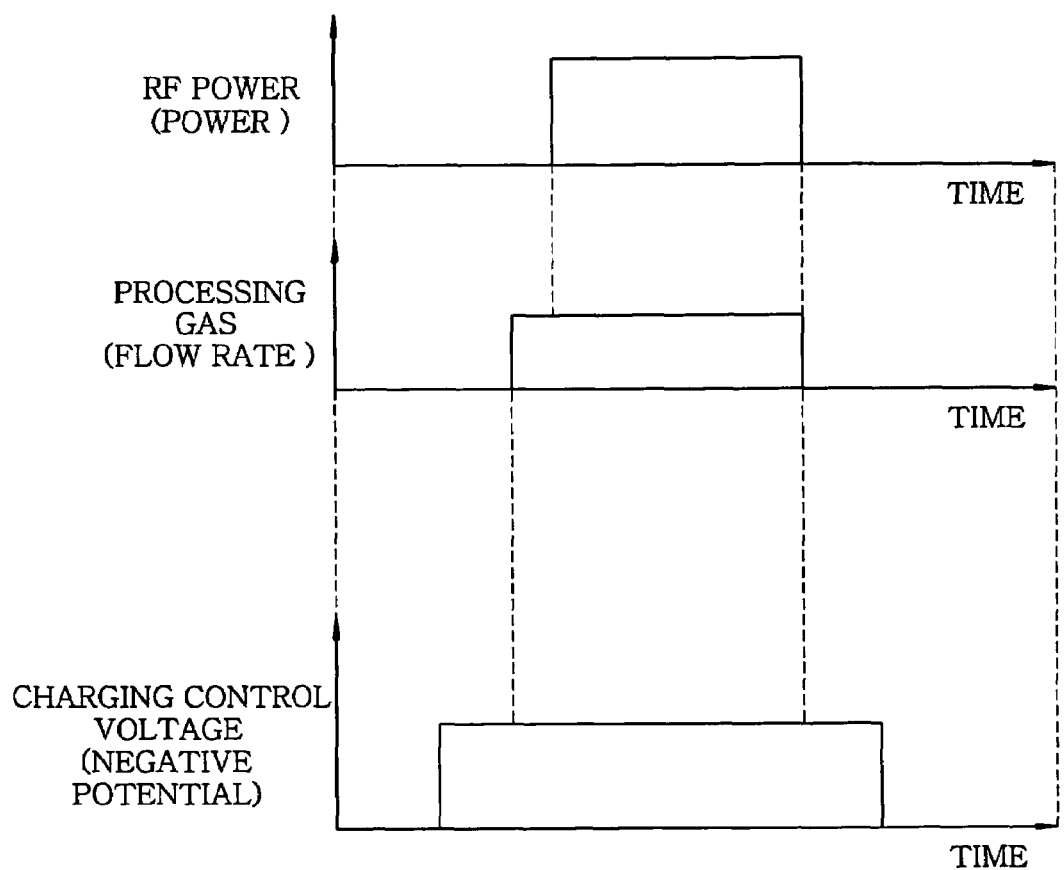
FIG. 2 describes a time sequence for explaining an operation of a particle removal apparatus in accordance with the first preferred embodiment of the present invention.

FIG. 2 describes one example for an application time of a charging control voltage to charging electrode 72 from the charging controller 74. In this example, a charging control voltage begins to be applied to the charging electrode 72 right before the processing gas is introduced into the chamber 10, and after completing the etching, i.e., after an elapse of a predetermined time from stopping supplying the processing gas and the high frequency power, applying the charging control voltage is stopped to return the potential of the charging electrode 72 to the ground potential.

It is preferable that the charging control voltage applied to the charging electrode 72 is of a large absolute value so as to sufficiently charge the particles. However, if the applying voltage (absolute value) is too large, abnormal discharge is developed between the charging electrode 72 and a plasma, between the charging electrode 72 and the chamber 10, or the like, or the plasma may be affected by the voltage applied to the charging electrode 72. Therefore, it is preferable that the charging control voltage is set within a range, e.g., about $-10$ V~$-500$ V such that a current running through the charging electrode 72 becomes sufficiently small (e.g., about 0.1 A) to thereby prevent such an undesirable phenomenon.

Next, an operational principle of a particle removal method in accordance with the embodiment (more generally, the present invention) will be discussed with reference to FIGS. 1 and 3.

Figure 3:
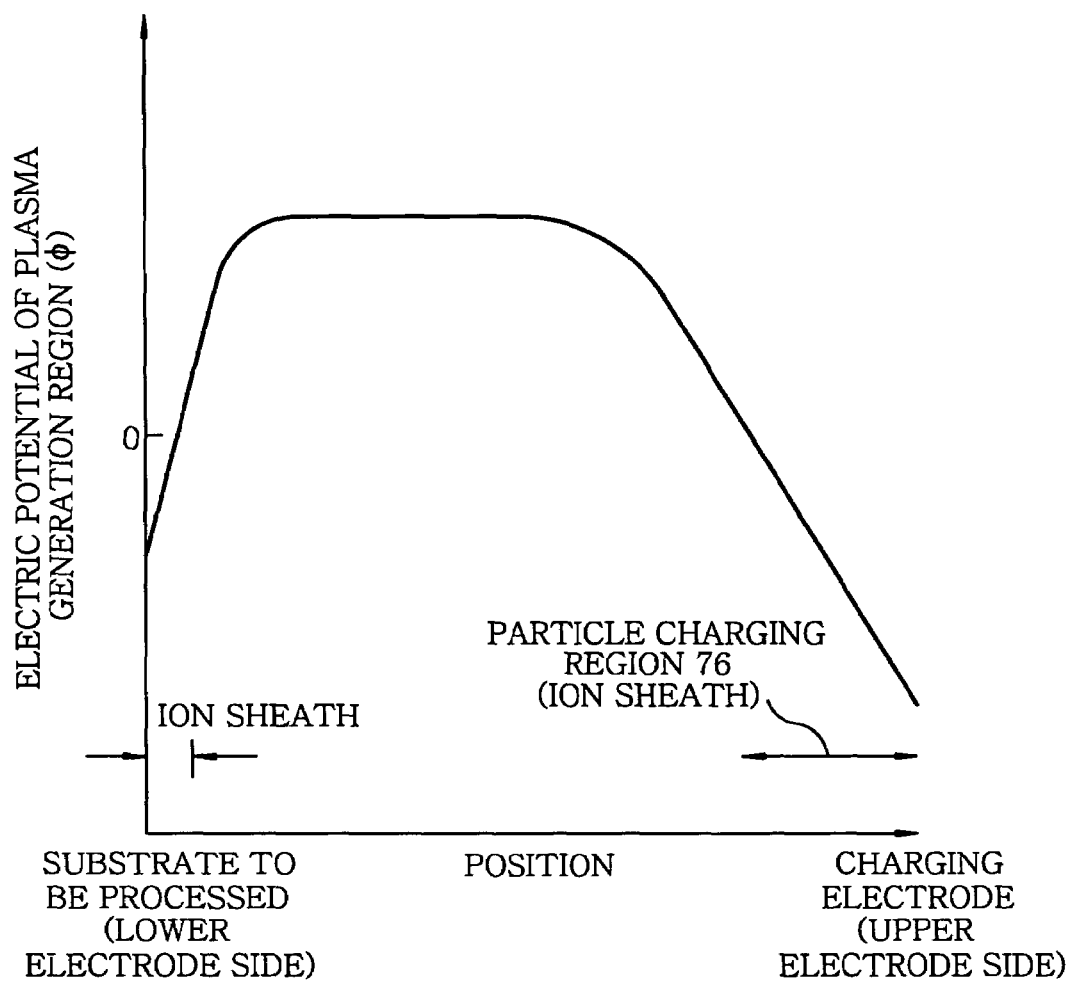
FIG. 3 illustrates a graph of typically showing an electric potential distribution while producing a plasma for explaining an operation of a particle removal apparatus in accordance with the present invention.

FIG. 3 is a graph for typically showing an electric potential distribution in a vertical direction in a plasma generation region between the lower electrode (susceptor) 12 and the upper electrode (shower head) 38 of the plasma etching apparatus (FIG. 1). In this plasma generation region, a plasma is produced by a so-called cathode coupling mode. In this graph, there is shown an electric potential distribution, in case where a negative voltage (e.g., $-200$ V) is applied to the charging electrode 72. As shown in FIG. 3, if the negative voltage ($-200$ V) is applied to the charging electrode 72, a particle charging region 76 is formed between a plasma PZ (FIG. 1) and the charging electrode 72 inside the upper electrode 38 (further exactly, inner side of the insulator 70). The particle charging region 76 means an ion sheath where an electric field by the negative potential of the charging electrode 72 is strengthened and many positive ions are present. Inside the chamber 10, particularly, many floating neutral particles produced in the plasma generation region becomes positively charged by colliding with the positive ions running toward the charging electrode 72 in the particle charging region 76. The positively charged particles are repelled from the plasma PZ of the positive potential and guided towards the charging electrode 72 of the negative potential by Coulomb force, to thereby move around the particle charging region while colliding with a surface of the insulator 70 inside the charging electrode 72 to be scattered therein. Meanwhile, as shown in FIG. 1, the particles indicated by 'O' finally reach the vicinity of the sidewall part of the chamber 10. In that region, the particles, while being under the influence of the attractive Coulomb force from the charging electrode 72 inside the chamber sidewall, are accelerated downward by the gravitational force along the flow of the exhaust gas and pass through the baffle plate 22, to thereby be exhausted from the chamber 10 through the gas exhaust port 24.

In the etching apparatus of this embodiment, to apply a horizontal magnetic field to the substrate W to be processed by the ring-shaped magnet 66, the plasma PZ is localized towards the substrate W to be processed. As mentioned above, if the plasma PZ is formed away from the charging electrode 72 inserted into the inner wall of the chamber 10, the plasma is less likely to be disturbed due to the application of the negative voltage to the charging electrode 72 so that it is possible to control the plasma more easily. In the present invention, it gets easier to charge a particle as the size thereof gets larger, but a particle of a size of several nm can be sufficiently charged in the particle charging region 76, as well. Further, such a localization of the plasma can be achieved by using a helicon wave plasma generation, ECR (Electron Cyclotron Resonance) plasma generation, or ICP (Inductive Coupled Plasma) plasma generation, instead of the magnetic field.

Figure 4:
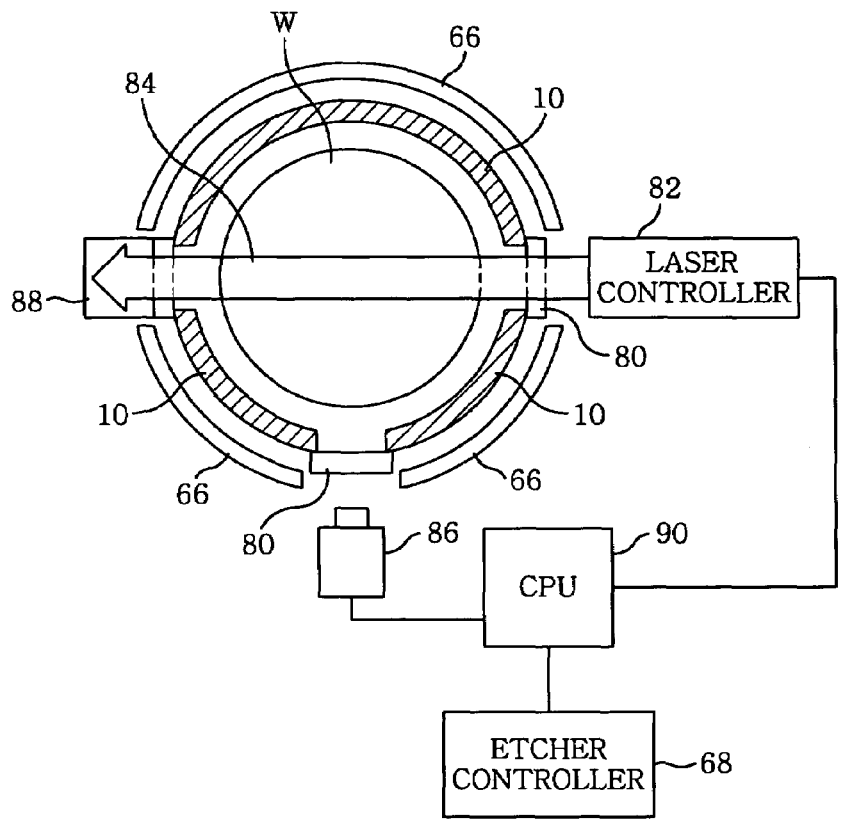
FIG. 4 offers a configuration of a particle measurement equipment for verifying an effect of the present invention.

Next, an operation and effect of the present embodiment will be discussed in the following example with reference to FIGS. 4 to 8. In this example, the particle measurement equipment shown in FIG. 4 was used so as to exactly understand the particle generation within the chamber 10. As shown in FIG. 4, a quartz window 80 was provided in a part of the chamber 10 and the ring-shaped magnet 66. A laser beam 84 having a flat beam section was incident on the vicinity of the upper side of the semiconductor wafer W in parallel with the surface thereof, via the quartz window 80 from a light source of the laser controller 82. If there was a particle present, a scattered light of the laser beam was continuously photographed by a CCD camera 86. Here, the laser beam 84 was extinguished by a light extinction unit 88 in order to eliminate a noise of the scattered light. A CPU 90 served to monitor an operation timing of the plasma processing apparatus by the etcher controller 68 and, at the same time, control a laser emission of the laser controller 82 and data process image information obtained by the CCD camera 86. In this example, by using such a particle measurement equipment, the particle generated during the operation of the plasma processing apparatus was measured in a real-time.

As for the substrate to be processed, a semiconductor wafer W having a diameter of 200 mmφ was used, and an etching of a silicon oxide film and particle removing were performed by following the time sequence as given in FIG. 2. More particularly, an inside of the chamber 10 was depressurized to a high vacuum of about $10^{-5}$ Pa, and then, a DC voltage of $-200$ V was applied to the charging electrode 72 from the charging control unit 74. Thereafter, a gaseous mixture of $C_4F_8/Ar/O_2$ was introduced into the chamber 10 as an etching gas of a processing gas to thereby maintain an inner pressure of the chamber 10 at about 5 Pa, and an RF power of 60 MHz and 1500 W was supplied to produce a plasma of corresponding etching gas. Therefore, a plasma etching was performed on the silicon oxide film on the semiconductor wafer W. Meanwhile, a magnetic flux density obtained by the ring-shaped magnet 66 was about 100 Gauss in the vicinity of a top surface of the semiconductor wafer W. After performing the etching for 1 minute, the gas and the RF power were stopped to be supplied. After 10 seconds, the potential of the charging electrode 72 returned to a ground potential, and after 10 seconds thereafter, the gate valve 66 was opened to transfer the semiconductor wafer W to a load-lock chamber of a neighboring chamber.

Figure 5:
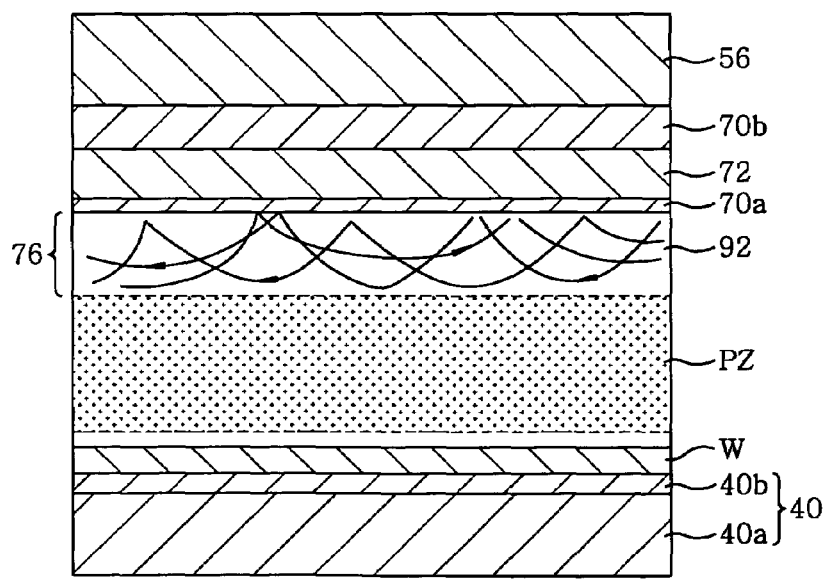
FIG. 5 is a view for typically showing a particle trajectory inside a chamber for explaining an operation and effect in accordance with the first preferred embodiment.

In case when performing a plasma etching processing described above, effects of the present invention on particle removal can be described as follows. FIG. 5 typically shows a particle trajectory obtained in a real-time measurement by the particle measurement equipment (FIG. 4). As shown in FIG. 5, the plasma PZ was produced in an upper part of the semiconductor wafer W, which was electrostatically adsorbed on the insulating film 40b of a surface of the electrode 40a in the electrostatic chuck 40, and the particle charging region 76 was formed between the plasma PZ and the insulator 70 on the surface of the charging electrode 72. Further, it was confirmed that a plurality of particle trajectories 92 was present in the particle charging region 76. This means that an electrically neutral particle collided with a positively charged ion in the ion sheath region (particle charging region 76) where an electric field was strengthened by the charging electrode 72 of the negative potential (−200 V), which was insulated and separated by the insulator 70b from the upper electrode plate 56 kept at the ground potential, and became positively charged after being combined with the positively charged ion to thereby move around the region. Further, the number of particles moving in the particle charging region 76 did not change much while producing the plasma. Meanwhile, simultaneously, a large number of particles reached the sidewall part of the chamber 10, as mentioned above, and was discharged downward along the sidewall part. Namely, in the present invention, the electrically neutral particle was positively charged continuously in the ion sheath region (particle charging region 76) where the field intensity was strengthened by the charging electrode 72 in the inner wall part (upper and side walls) of the chamber 10, and the positively charged particles were discharged from the chamber 10 through the ion sheath region extending downward along the sidewall part of the chamber 10.

Figure 6:
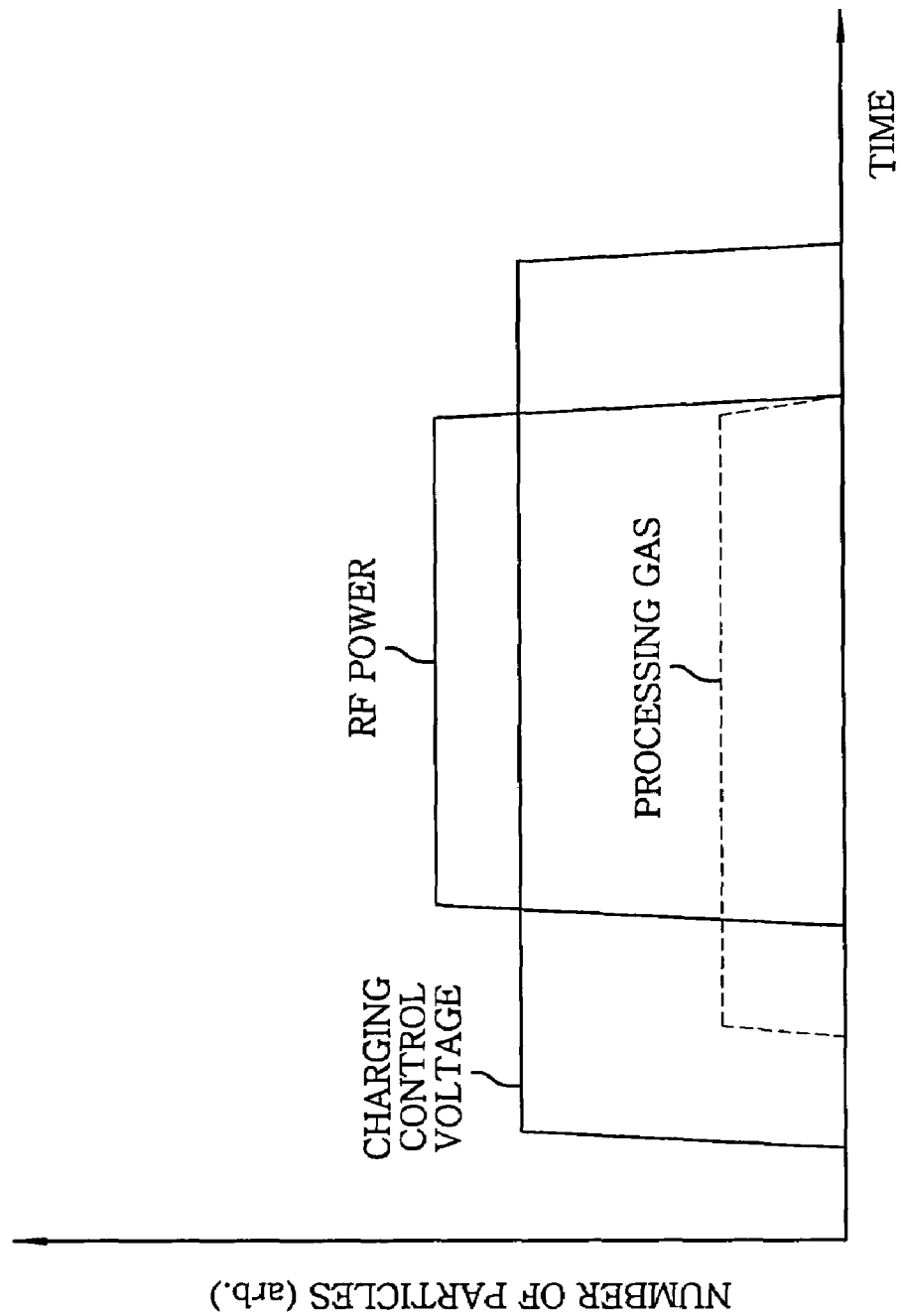
FIG. 6 provides a graph for showing a time sequence variation of the number of particles measured by a particle measurement equipment in the first preferred embodiment.
Figure 7:
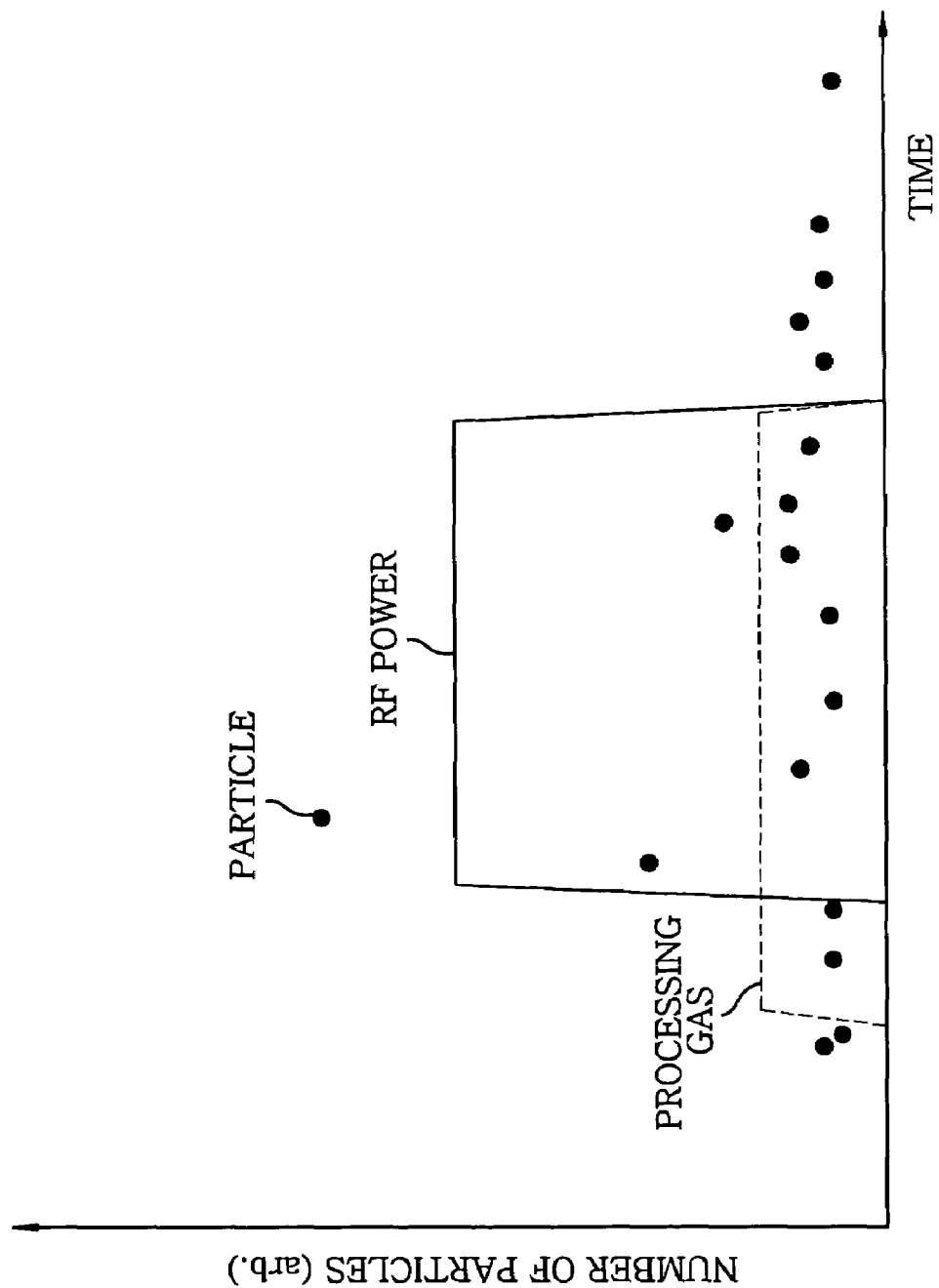
FIG. 7 presents a graph for showing a time sequence variation of the number of particles measured by a particle measurement equipment, when the present invention is not applied.

Further, the number of particles floating in the vicinity of the top surface of the semiconductor wafer W during the etching processing was measured and examined. FIG. 6 is a graph for showing a result in a case of adopting the particle removal apparatus of the present invention, and FIG. 7 is for a case (reference example) when the particle removal apparatus of the present invention was not used in the same plasma processing apparatus as FIG. 6. In FIGS. 6 and 7, a horizontal axis corresponds to a time axis of time sequence in the etching processing, and a vertical axis corresponds to the number of particles indicated as '●' mark.

In the present invention, the processing gas and the RF power were provided in the same sequence as that in FIG. 2, and no particles were observed in the vicinity of the top surface of the semiconductor wafer W while the charging controller was operated (i.e., while a charging control voltage was applied to the charging electrode 72), as known from FIG. 6. On the other hand, in FIG. 7, the particles began to appear when the processing gas was introduced, and had been observed throughout the etching processing even though the number of particles varied somewhat. This means that in accordance with the present invention, the number of particles generated during the etching processing and attached to the substrate to be processed can be substantially reduced by positively charging the particles and removing them. Generally, it is considered that there are particles charged negatively by a plasma during the plasma processing, as well. However, in the etching processing of the present invention, the negatively charged particles were not generated, and if any, a very small amount of particles was generated.

Figure 8:
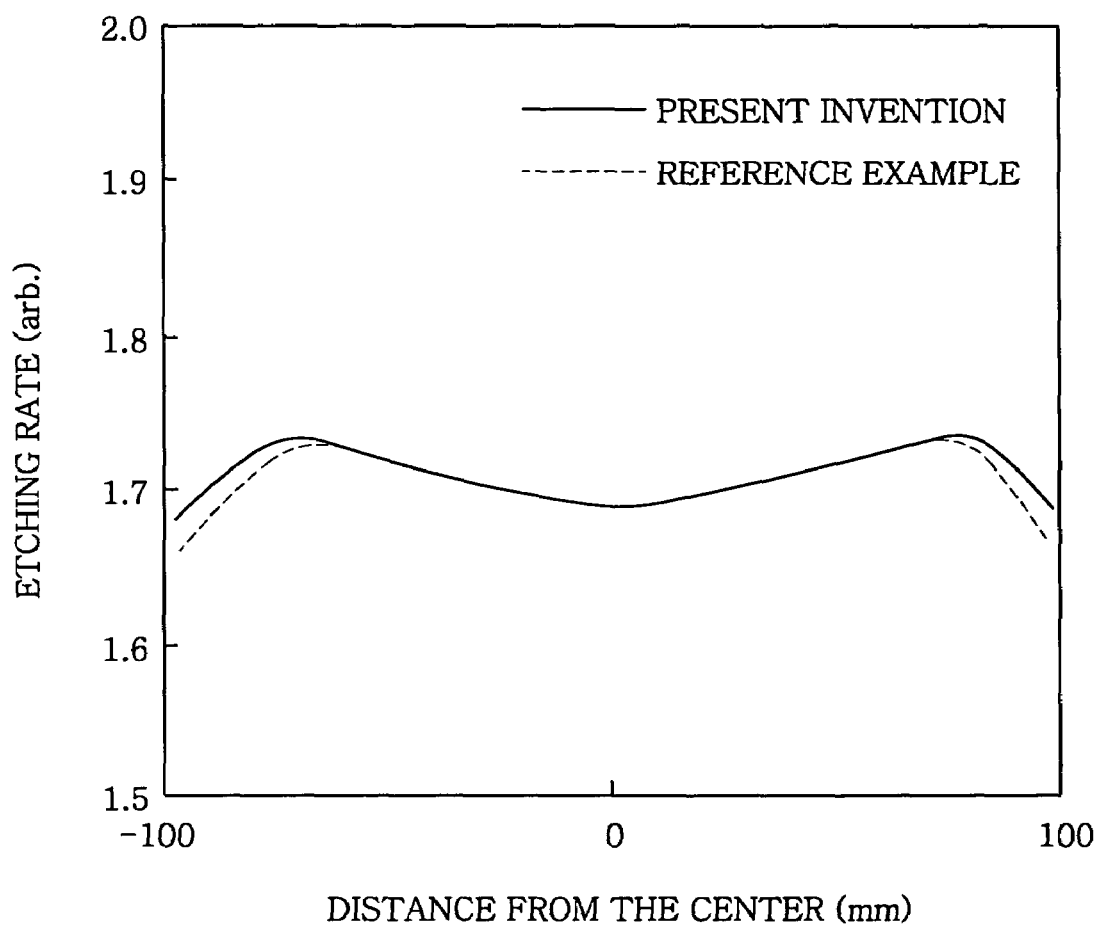
FIG. 8 depicts a distribution map of an in-surface etching rate of a silicon substrate when plasma etching a silicon oxide film in the first preferred embodiment.

Meanwhile, it is confirmed that the plasma disturbance caused by operating the particle removal apparatus of the present invention is of an ignorable level. FIG. 8 shows an etching rate characteristic, wherein a solid line is for the present invention and a dot line is for the reference example in which the particle removal apparatus of the present invention is not adopted. As is clear from FIG. 8, the etching rate does not vary within an error range. As mentioned above, the particle removal apparatus of the present invention does not affect the plasma distribution characteristic of the plasma processing apparatus and can effectively remove the particle generated within the chamber 10. Further, the particle removal apparatus of the present invention is configured to have the charging electrode 72 and the insulator 70, which are equipped in the inner wall of the chamber in the plasma processing apparatus, and the charging controller 74 outside the chamber, and can remove the particle in a very simple way. Therefore, the particle removal apparatus of the present invention can find a high applicability in a wide range of field. Meanwhile, the aforementioned example describes an etching of the silicon oxide film but CVD (chemical vapor deposition) thereof or the like can be performed in the completely same manner.

Second Embodiment

Figure 9:
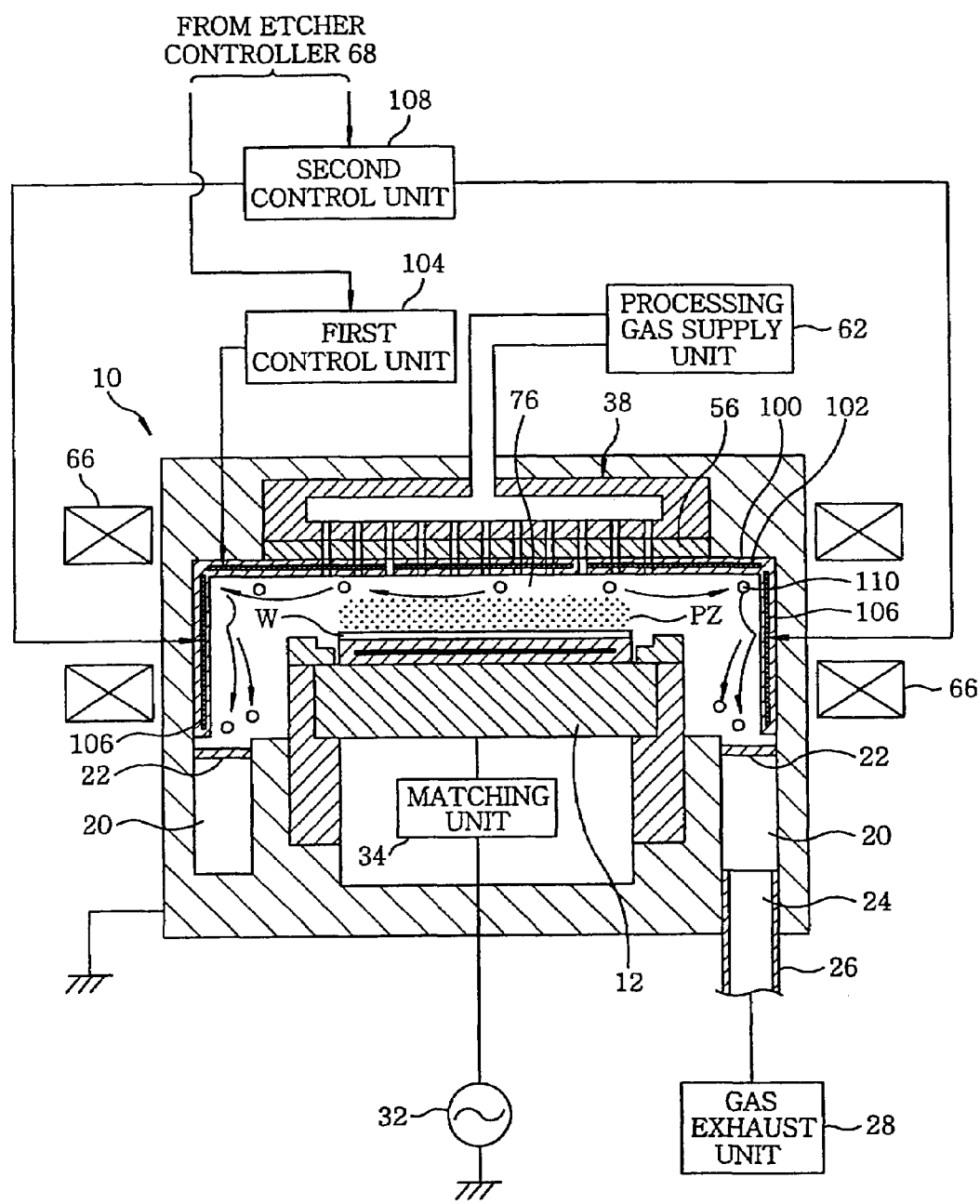
FIG. 9 represents a configuration of a plasma etching apparatus adopting a particle removal apparatus in accordance with a second preferred embodiment of the present invention.

FIG. 9 shows a configuration of a plasma etching apparatus having a particle removal apparatus in accordance with a second preferred embodiment of the present invention. In the drawing, like reference numerals will be assigned to like parts having substantially same configurations or functions, and redundant description thereof will be omitted in the specification and the accompanying drawings. Here, a characteristic feature of the second preferred embodiment will be discussed mainly. In the second preferred embodiment, a member for performing a drift transfer on a positively charged particle in a particle charging region 76, same as in the aforementioned first embodiment, is included, so that a particle can be discharged outside the chamber further efficiently.

As shown in FIG. 9, a first charging electrode 102 embedded in a film-shaped insulator 100 is installed in an inner wall of the ceiling of a chamber 10 containing the inner wall surface of an electrode plate 56 of a shower head 38. A negative voltage is applied to the first charging electrode 102 from a first control unit 104. It is preferable that the first control unit 104 has a variable output voltage DC power source, and controls a potential of the first charging electrode 102 and a timing of applying a voltage under the control of an etcher control unit 68 (FIG. 1). The first charging electrode 102 and the first control unit 104 serve as a particle charging control member, mainly.

Further, a second charging electrode 106 embedded in the insulator 100 is installed in the inner side of the sidewall of the chamber 10. A negative voltage is applied to the second charging electrode 106 from a second control unit 108. It is preferable that the second charging electrode 106 has a variable output voltage DC power source, and controls a potential of the second charging electrode 106 and a timing of applying a voltage under the control of the etcher control unit 68 (FIG. 1). The second charging electrode 106 and the second control unit 108 serve as a particle transfer member, mainly. Meanwhile, the first and the second charging electrode 102 and 106 may be formed of a film-shaped or a sheet-shaped conductor such as aluminum, stainless steel, or the like. The insulator 100 is made of a film-shaped ceramic, e.g., alumina that, e.g., an aluminum surface is alumite treated, and entire surfaces (inner and outer surfaces) of the first and the second charging electrode 102 and 106 are coated therewith.

Figure 10:
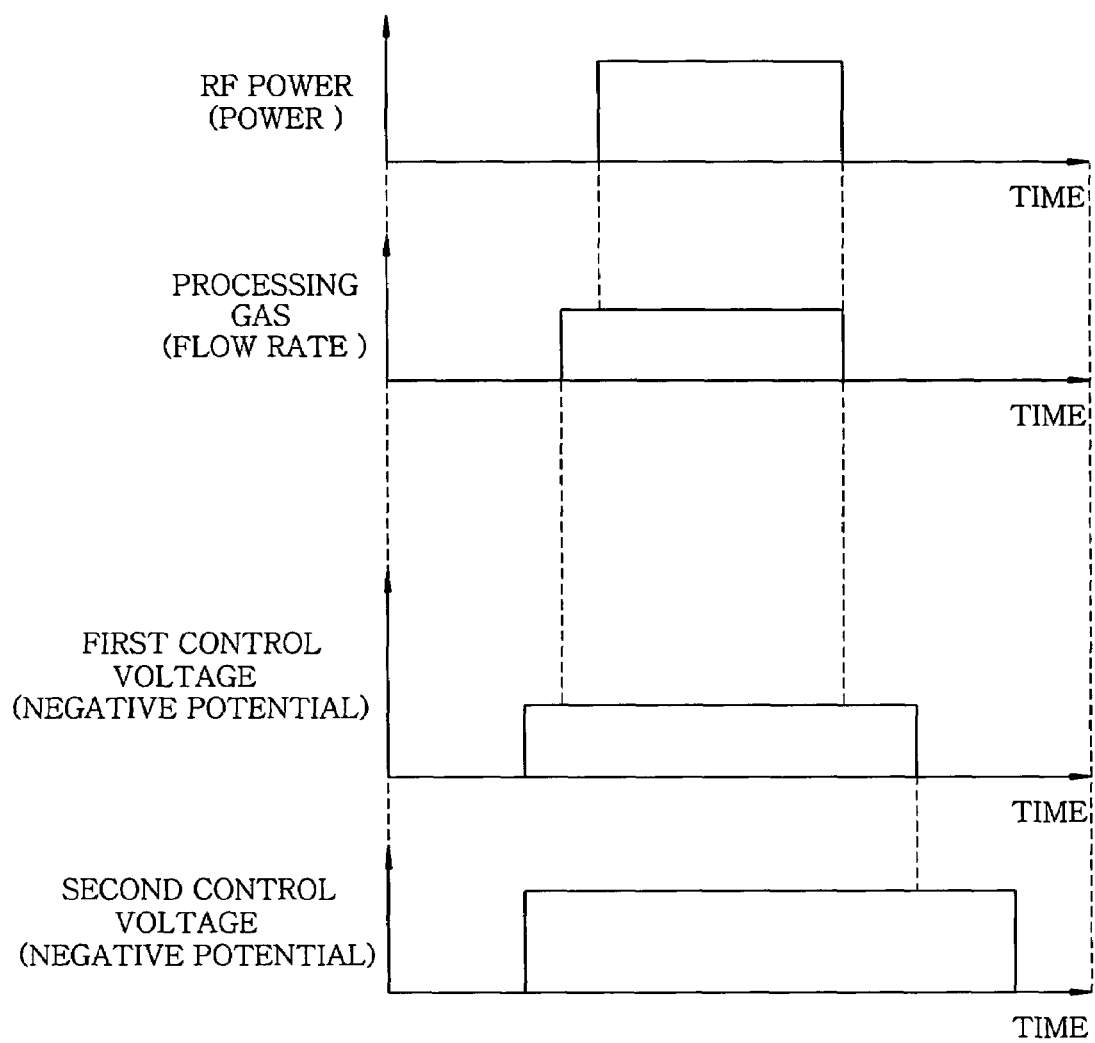
FIG. 10 sets forth a time sequence for explaining an operation of a particle removal apparatus in accordance with a second preferred embodiment.

FIG. 10 shows a time sequence in this embodiment. When performing a plasma etching, it is preferred that the negative voltages (the first and the second control voltage) begin to be applied to the first and the second charging electrode 102 and 106 from the first and second control units 104 and 108, respectively, right before introducing the processing gas into the chamber 10. Here, it is preferred that an absolute value of the negative voltage applied to the second charging electrode 106 (the second control voltage) is set to be greater than that of the first charging electrode 102 (the first control voltage). For example, −100 V and −200 V may be applied to the first and the second charging electrode 102 and 106, respectively. Same as in the first embodiment, the negative voltages (the first and the second control voltage) are continuously applied to the first and the second charging electrode 102 and 106 during the etching processing, as well. Further, after completing the etching processing and thus stopping supplying the processing gas and the high frequency power, application of the negative voltage (the first control voltage) to the first charging electrode 102 is stopped first. Subsequently, after an elapse of a predetermined time, it is preferred that the application of the negative voltage (the second control voltage) to the second charging electrode 106 is stopped.

Like in the first embodiment, a particle is generated within the chamber 10 during the plasma etching, and the particle charging region 76 is formed between the plasma PZ and the first charging electrode 102 (more precisely, inner side of the insulator 70) under the electrode plate 56, by the application of the negative voltage (the first control voltage) to the first charging electrode 102. As a result, the particle generated during the plasma etching collides with the positively charged ion in the particle charging region 76 and is combined therewith to thereby become positively charged. The positively charged particle moves in the particle charging region 76, while a repulsive Coulomb force from the plasma PZ having a positive electric potential is exerted thereon and an attractive Coulomb force from the first charging electrode 102 of the negative potential is applied thereto at the same time. Further, as shown in FIG. 9, the particles 110 moving away from the plasma PZ above the substrate W to be processed towards the end of the first charging electrode 102 are forced to be drift transferred to the sidewall of the chamber by the attractive Coulomb force from the second charging electrode 106 of the sidewall of the chamber. As mentioned above, by making the absolute value of the negative potential of the second charging electrode 106 greater than that of the first charging electrode 102, it is possible to perform the drift transfer strongly and effectively. The particles, which are transferred to the inner side of the sidewall of the chamber 10, are accelerated downward by the gravitational force along the flow of the exhaust gas and pass through a baffle plate 22, to thereby be exhausted from the chamber 10. Therefore, in accordance with the second preferred embodiment, it is possible to remove the particle within the chamber 10 more efficiently, as compared with the first embodiment.

Third Embodiment

Figure 11:
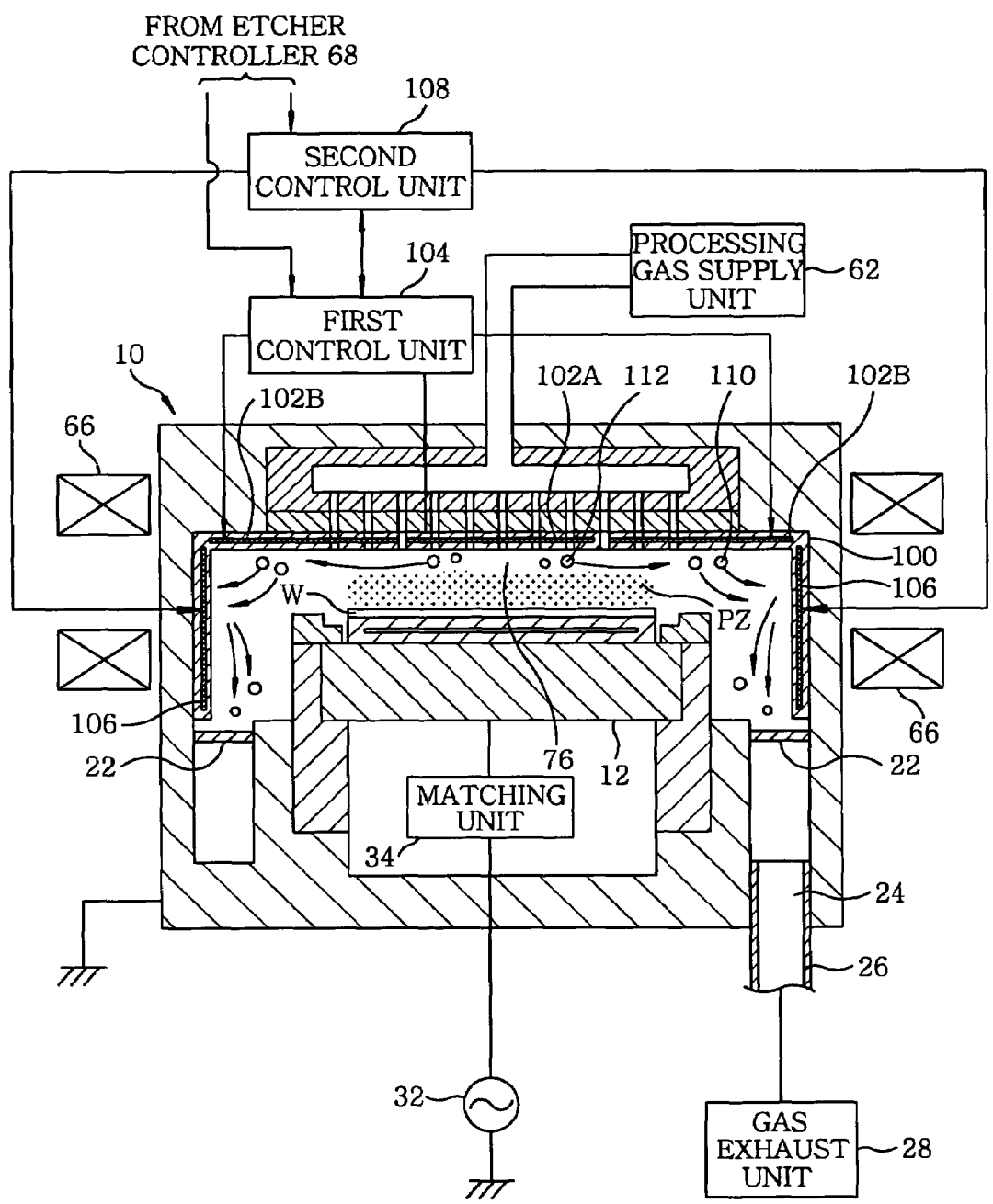
FIG. 11 shows a configuration of a plasma etching apparatus adopting a particle removal apparatus in accordance with a third preferred embodiment of the present invention.

FIG. 11 shows a configuration of a plasma etching apparatus having a particle removal apparatus in accordance with a third preferred embodiment of the present invention. In the drawing, the same reference numerals with those of the first and the second embodiment (FIGS. 1 and 9) will be assigned to like parts having substantially same configurations or functions, and redundant description thereof will be omitted in the specification and the accompanying drawings. Here, a characteristic feature of the third preferred embodiment will be discussed mainly. In the third embodiment, means or a method for more forcibly transferring or delivering the particles charged positively in a particle charging region 76 is included, so that the particles can be discharged outside a chamber 10 more efficiently, as compared with the second embodiment.

As shown in FIG. 11, an upper charging electrode 102 is divided into a central charging electrode 102A and a peripheral charging electrode 102B in a diametrical direction, wherein the upper charging electrode 102 is installed in the inner wall surface of the ceiling of the chamber 10 containing the inner wall of an electrode plate 56 of a shower head (upper electrode) 38. For example, it is preferable that a plane shape of the central charging electrode 102A is a circle and that of the peripheral charging electrode 102B is a ring shape of a concentric circle with the central charging electrode 102A. A first control unit 104 is configured such that respective negative voltages (first control voltages A and B) are independently applied to the central charging electrode 102A and the peripheral charging electrode 102B while having a predetermined specific timing relation (phase difference) therebetween. Further, the central charging electrode 102A, the peripheral charging electrode 102B, and the first control unit 104 are configured to serve as particle charging control means and particle transfer means.

Further, a second charging electrode 106 embedded in an insulator 100 is installed in the inner wall of the chamber 10. Same as in the second embodiment, a second control unit 108 controls a potential of the second charging electrode 106 and a timing of applying a voltage. Meanwhile, it can be configured such that the first and the second control unit 104 and 108 receive control signals from an etcher control unit 68 (FIG. 1), respectively, and at the same time, send and receive the control signals therebetween so as to match a timing of applying each voltage.

Figure 12:
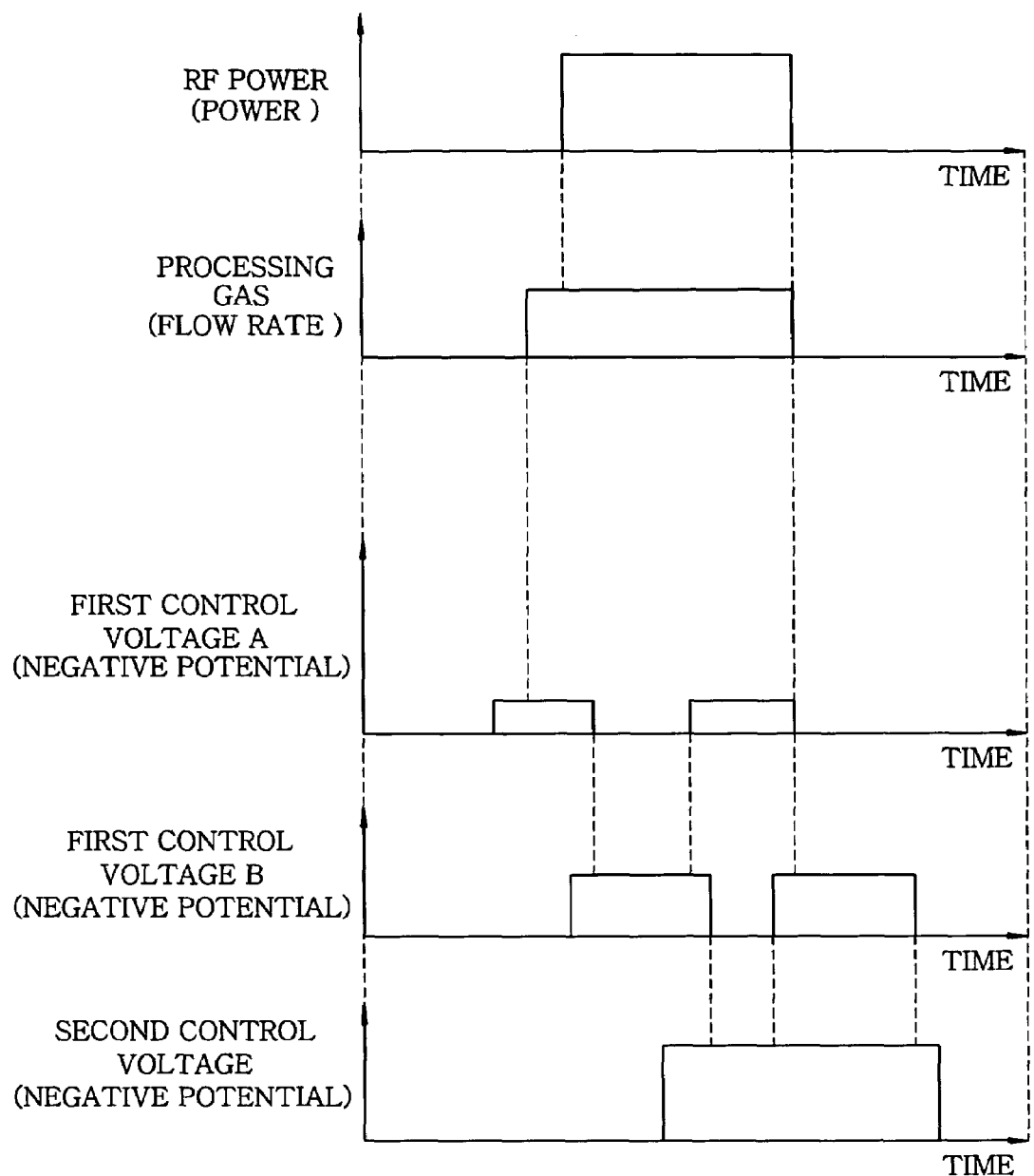
FIG. 12 describes a time sequence for explaining an operation of a particle removal apparatus in accordance with the third preferred embodiment.

FIG. 12 shows a time sequence of this embodiment. The sequence of the plasma processing itself is the same as those of the first and the second embodiment. Namely, a processing gas is supplied into the chamber 10, and then, an RF power is applied to a susceptor 12 from a high frequency power source 32 to produce a plasma PZ of a corresponding processing gas. In this embodiment, negative voltage pulses of different phases from each other, i.e., the first control voltages A and B, are applied to the central charging electrode 102A and the peripheral charging electrode 102B, respectively, from the first control unit 104, with the same timing as that shown in FIG. 12. In such a case, it may be configured such that a pulse output to the central charging electrode 102A is started first, from the first control voltage A, and a pulse of the second control voltage B to the peripheral charging electrode 102B is outputted at the last time. In FIG. 12, a phase difference between the first control voltages A and B is set about 180°, but any phase difference may be selected. Here, it is preferred that an absolute value of the negative potential of the first control voltage B is set to be greater than that of the first control voltage A, for example, A=−100 V and B=−200 V.

The particles generated during the plasma etching are positively charged in the particle charging region 76 in the vicinity of the central charging electrode 102A and the peripheral charging electrode 102B. The positively charged particles move around in the particle charging region 76, while being repulsed from the plasma PZ having a positive electric potential by Columbic force and, at the same time, being attracted from the first charging electrode 102 of the negative potential by Columbic force. Further, in this case, since the negative voltages of rectangular periodic pulses, whose phases are deviated from each other, are applied, the positively charged particles 112 (FIG. 11) under the central charging electrode 102A are attracted towards the peripheral charging electrode 102B and delivered thereto during a time zone when the first control electrode A becomes of a low level (ground potential) and the first control electrode B becomes of a high level (−200 V), as shown in FIG. 12. Such a particle transfer can be performed more effectively by repeatedly applying the negative voltages A and B whose phases are deviated from each other. Therefore, the whole positively charged particles formed in the central area of the ceiling on the chamber 10 are transferred to the peripheral side thereof.

Further, the second control voltage from the second control unit 108 is applied to the second charging electrode 106 in a predetermined timing with respect to the pulse apply control of the first control voltages A and B by the first control unit 104 mentioned above (FIG. 12). Here, an absolute value of the negative potential of the second charging electrode 106 is set to be greater than that of first control voltage B. For example, if the first control voltage B is −200 V, the second control voltage may be −300 V. By doing this, the particles 110 reaching the peripheral charging electrode 102B are forced to be drift transferred to the sidewall of the chamber by a strong attractive force from the second charging electrode 106, which is installed in the sidewall part of the chamber.

After stopping supplying the processing gas and the high frequency power, in order to complete the plasma etching processing, it can be configured such that the negative voltages (the first control voltage B and the second control voltage) are continuously applied to the peripheral charging electrode 102B and the second charging electrode 106 for a predetermined time, and the positively charged particles are kept being delivered and transferred (FIG. 12). Therefore, the particles generated within the chamber 10 are gravitationally accelerated downward along the flow of the exhaust gas, and pass through the baffle plate 22, to thereby be discharged from the chamber 10 through the gas exhaust port 24.

In accordance with the third embodiment, it is possible to remove the particles generated in a substantially central part of the ceiling of the chamber 10 more efficiently, as compared with the second embodiment. Further, such an effect can be further increased as the diameter of the cylindrical chamber 10 becomes large. Meanwhile, even in case where the negative voltages of the first control voltages A and B are set at a same value with each other, the particles can still be transferred even though the efficiency thereof is reduced a little.

Fourth Embodiment

Figure 13:
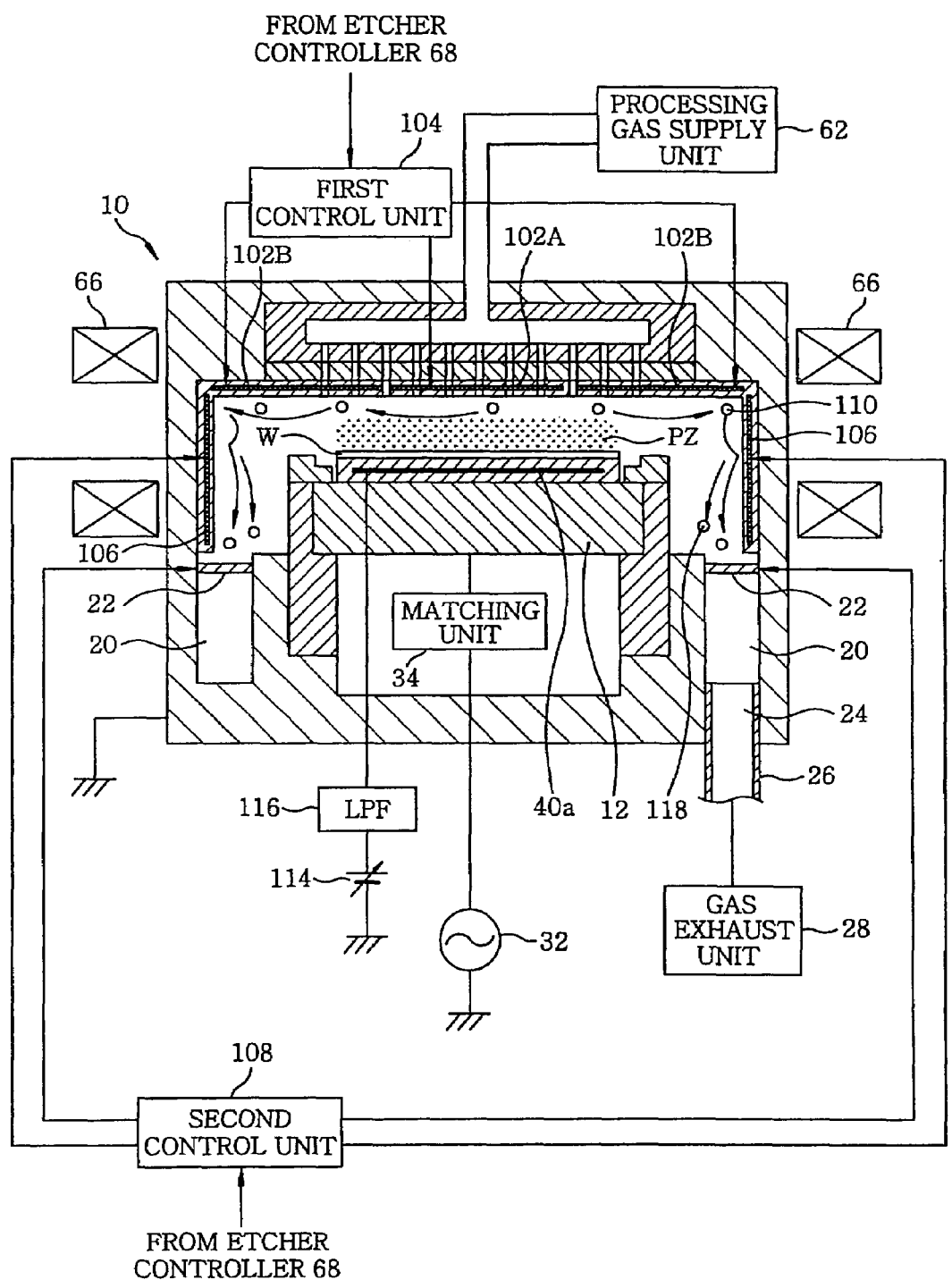
FIG. 13 illustrates a configuration of a plasma etching apparatus adopting a particle removal apparatus in accordance with a fourth preferred embodiment of the present invention.

FIG. 13 shows a configuration of an apparatus in accordance with a fourth embodiment. The fourth embodiment is same as the third one, except that two characteristic features are added. The first characteristic feature is that a DC positive voltage is applied to a substrate W side (e.g., the electrode 40a of an electrostatic chuck 40) to thereby repel a positively charged particle therefrom in order to prevent the falling of the positively charge particle onto a substrate W to be processed. For this, a variable output voltage DC power source 114 is electrically connected to an electrostatic chuck electrode 40a on a susceptor 12, via a low-pass filter 116. Here, the low-pass filter 116 functions to cut off a high frequency from a high frequency power source 32.

A second characteristic feature is that the particle removing is facilitated by applying a negative voltage to a baffle plate 22 disposed in an opening of a gas exhaust path 20 in a bottom part of a chamber 10. In FIG. 13, a negative voltage B (the second control voltage) is applied to the baffle plate 22 from a second control unit 108. Here, it is preferred that an absolute value of the second control voltage B applied to the baffle plate 22 is set to be greater than that of the second control voltage A for the second charging electrode 106. For example, if the second control voltage A is −300 V, the second control voltage B may be set to −400 V. Meanwhile, an insulating material (not shown) is installed between the baffle plate 22 and the sidewall of the chamber 10 so as to electrically insulate them from each other.

Figure 14:
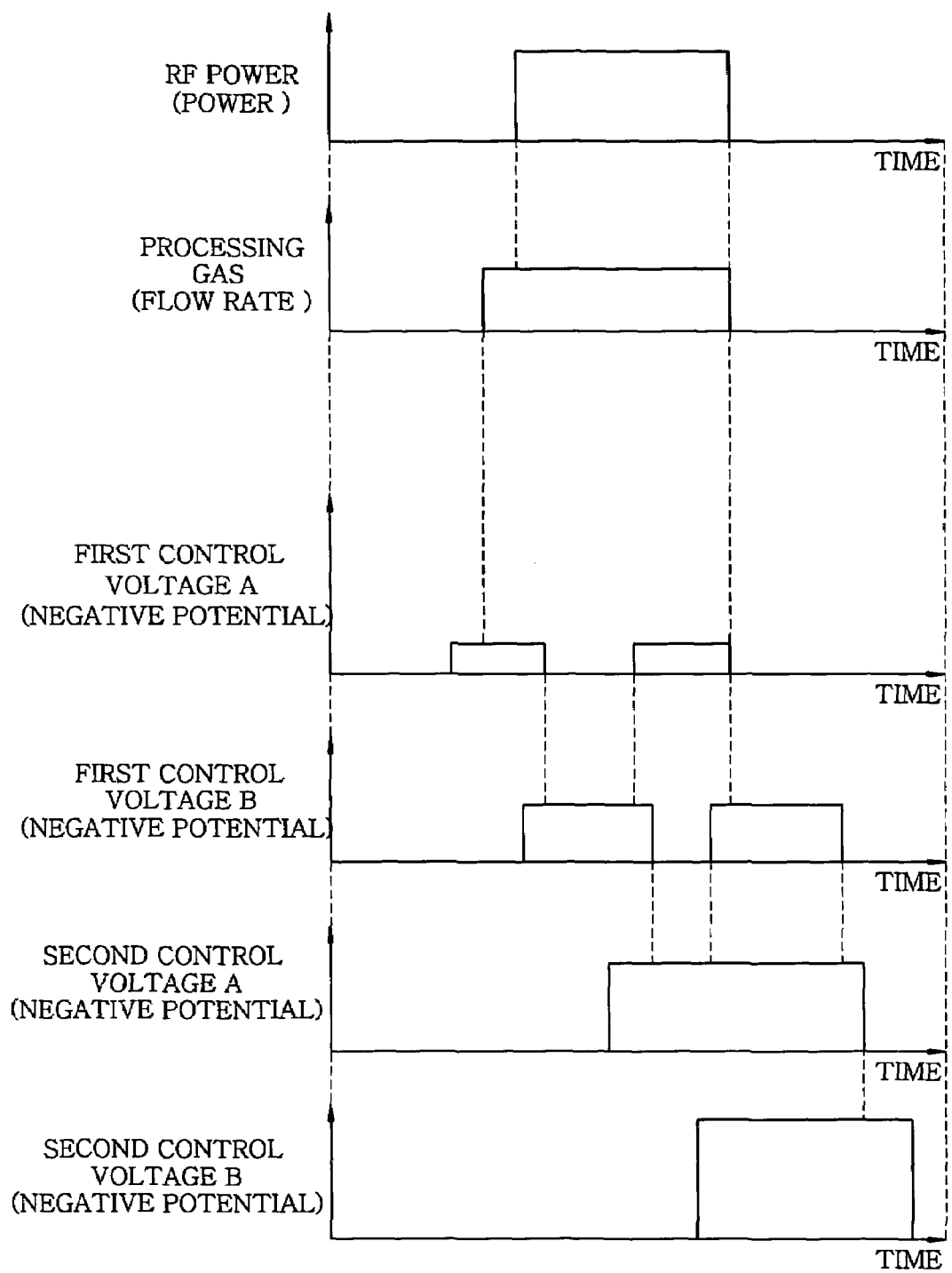
FIG. 14 offers a time sequence for explaining an operation of a particle removal apparatus in accordance with the fourth preferred embodiment.

FIG. 14 shows a time sequence of the fourth embodiment. As shown in FIG. 14, it is configured such that a second control voltage B for the baffle plate 22 is added to the sequence (FIG. 12) of the third embodiment. Preferably, the second control voltage B is applied to the baffle plate 22 with a predetermined phase difference from the second control voltage A for the second charging electrode 106 (i.e., waiting a little while). Accordingly, positively charged particles 118 are drift transferred to the baffle plate 22 from the sidewall of the chamber. As shown in FIG. 14, after stopping supplying the processing gas and the high frequency power in order to complete the plasma etching processing, the negative voltages are applied to the peripheral charging electrode 102B, the second charging electrode 106, and the baffle plate 22 (the first control voltage B, the second control voltage A, and the second control voltage B), respectively. Further, the positively charged particles continue to be delivered and transferred.

Further, though not shown in FIG. 14, a DC positive voltage may be applied to a substrate to be processed W from a DC power source 114. For example, this voltage may be set within the range of 100 V to 3000 V. The positive voltage is applied prior to the RF power, and stopped prior to transferring the substrate W to be processed into a neighboring chamber from the chamber 10, same as the case where the negative voltage is applied to the charging electrode (particularly, the upper charging electrode 102). By applying the positive voltage to the substrate W to be processed, particles charged positively by a charging effect of the aforementioned charging electrode are repulsed from the substrate W to be processed by Columbic force, so that falling onto the substrate W to be processed can be completely prevented.

Figure 15:
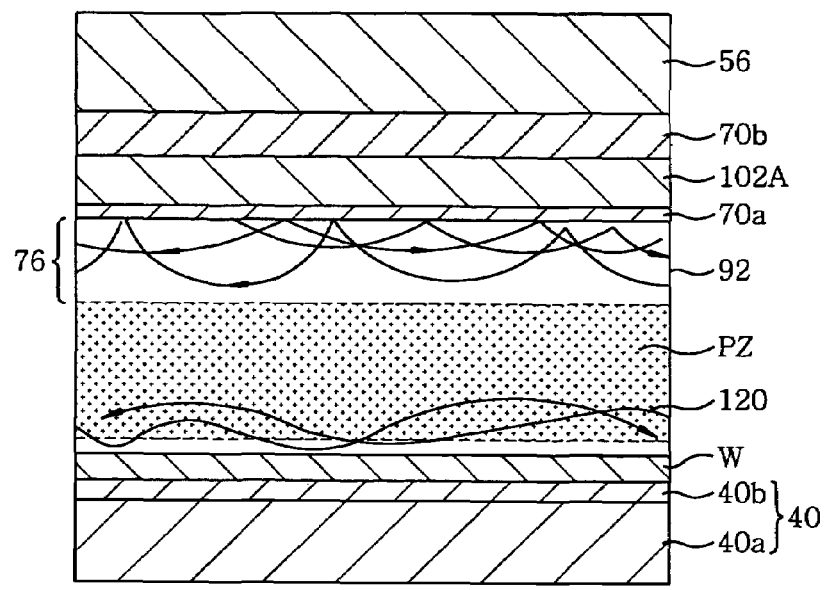
FIG. 15 is a view for typically showing a particle trajectory inside a chamber for explaining an operation and effect in accordance with the fourth preferred embodiment.
Figure 16:
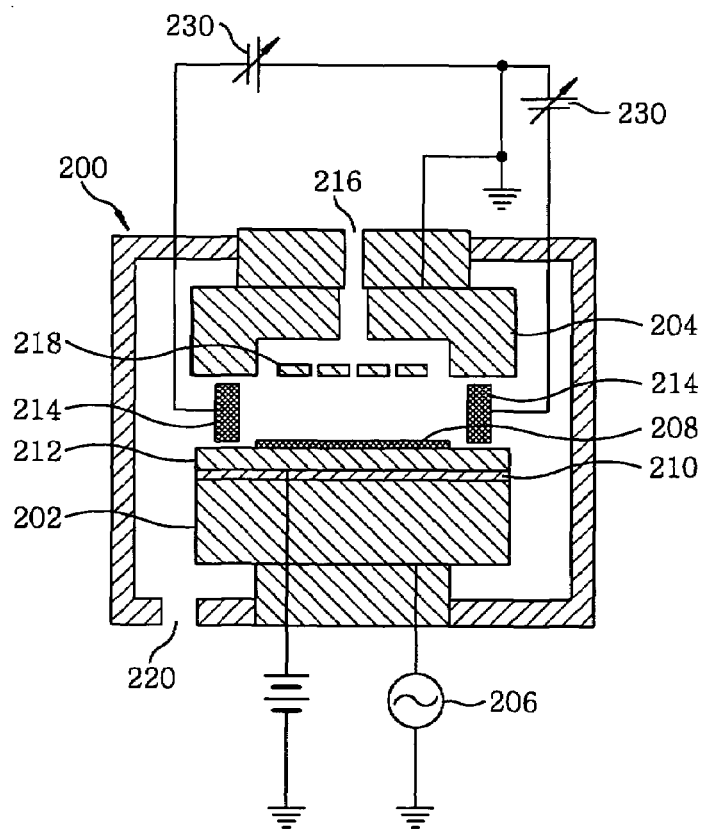
FIG. 16 provides a configuration of a plasma etching apparatus having a particle removal apparatus of a prior art.
Figure 17:
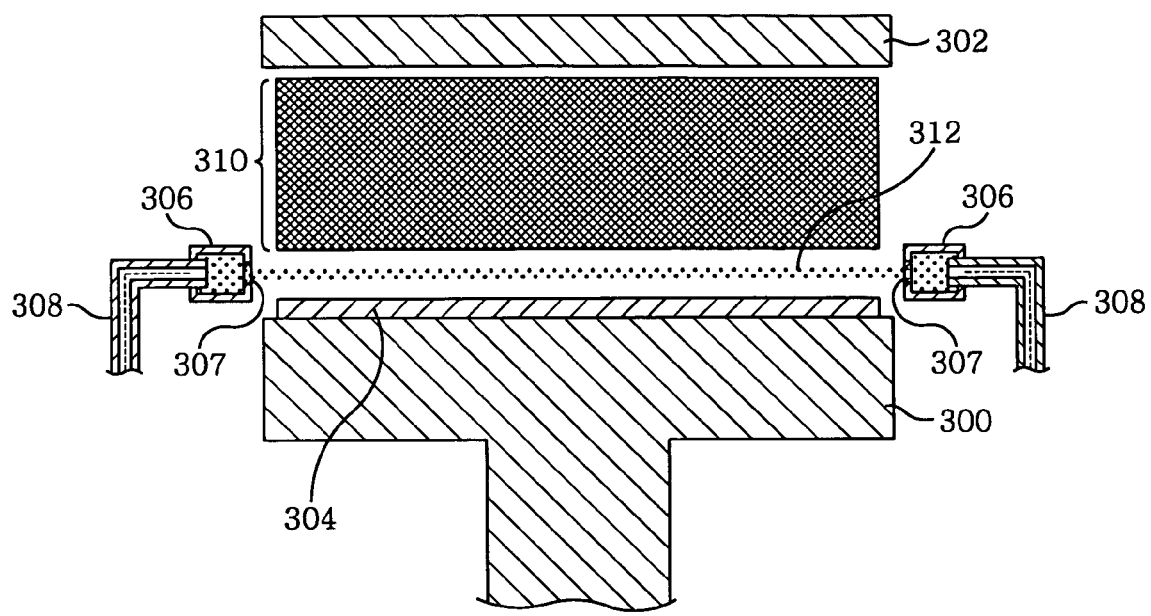
FIG. 17 presents a particle removal apparatus of another prior art.

Next, an operation and effect obtained by applying the positive voltage to the substrate W to be processed will be discussed with reference to FIG. 15. FIG. 15 typically shows particle trajectories obtained in a real-time measurement by the particle measurement equipment (FIG. 4), similar to FIG. 5. As shown in FIG. 5, a particle charging region 76 is formed between a plasma PZ and an insulator 70a (100) on a surface side of a central charging electrode 102A and a plurality of particle trajectories 92 is observed in this region 76. Here, an electrode plate 56 is disposed on the central charging electrode 102A embedded in an insulator 70b (100). Meanwhile, the particles falling into the substrate W to be processed, which is mounted on an insulator 40b of a surface of an electrode 40a, are subject to a repulsive force from the surface of the substrate W to be processed and leave particle trajectories 120 between the plasma PZ and the substrate W to be processed. As mentioned above, the positively charged particles reaching the substrate W to be processed are repulsed from the substrate W to be processed and the plasma PZ, and finally pushed aside the sidewall part of the chamber 10. Further, the positively charged particles are gravitationally accelerated downward along the flow of the exhaust gas and pass through the baffle plate 22 to thereby be exhausted from the chamber 10 through an exhaust port 24. Therefore, it is possible to remove and discharge the particles generated within the chamber 10, more efficiently.

Meanwhile, in the second and the third embodiment, the plasma etching was performed on the silicon oxide film in the same manner as the first embodiment, by operating the particle removal apparatus of the present invention. As a result, a superior in-surface uniformity of the silicon oxide film in the semiconductor wafer (silicon substrate) corresponding to the substrate to be processed and the particle removal effect could be confirmed.

In the aforementioned embodiment, the electrode for positively charging the particle may be installed in a desired area inside the chamber 10, separately. In particular, the charging electrode 106 in the sidewall part of the chamber can be divided into a plurality of regions as well as the charging electrodes 102A and 102B of a shower head 38 side. In this case, by properly controlling a value of the negative voltage applied to each of the divided charging electrodes or an application timing, and drift transferring or delivering, the particles may be discharged efficiently from the chamber. Further, the control unit for adjusting and controlling these charging electrodes may be collected on one part.

Further, it can be configured such that the electrode for positively charging the particle is equipped only in the inner wall of the ceiling of the chamber 10, or only in the sidewall of the chamber 10. Meanwhile, the method for applying the positive potential to the substrate W to be processed or the method for applying the negative voltage to the baffle plate 22 may be applied to the third embodiment. Further, the method for applying the positive potential to the substrate W to be processed and/or the method for applying the negative voltage to the baffle plate 22 may be applied to the first and the second embodiment.

In the second to fourth embodiments, a deposition shield may be used as an example of the second charging electrode 106 installed in the sidewall of the chamber, as disclosed in international publication WO 00/075,972, wherein the deposition shield is made of aluminum whose surface is alumite treated. In this case, an inner part, where alumite treatment is not performed, in the deposition shield serves as the second charging electrode.

In the aforementioned embodiments, the negative voltage is applied to the charging electrode installed in the inner wall of the chamber from the DC power source, in order to form the particle charging region. However, the present invention is not limited thereto, and the high frequency may be applied to the charging electrode installed in the inner wall of the chamber from the high frequency power source via capacitance coupling. In such a method, the ion sheath region formed above the plasma PZ may be used as the particle charging region by increasing the field intensity therein.

In the present invention, the particles generated within the plasma processing apparatus are positively charged, and the positively charged particles are discharged from the chamber by a drift delivering or a transferring method. However, a particle negatively charged by an electron in the plasma may exist depending on a plasma processing condition. In such a case, a device for collecting the negatively charged particle may be additionally installed in the configuration of the present invention. The device for collecting the negatively charged particle can be configured such that an electrode, to which the positive voltage is applied, is equipped in a region, where the negatively charged particle is generated, inside the chamber.

While the invention has been shown and described with respect to the preferred embodiments, it will be understood by those skilled in the art that various changes and modifications may be made without departing from the spirit and scope of the invention as defined in the following claims. For example, in the aforementioned parallel plate type electrode, the cathode coupling mode is only an example. In addition, the present invention may be applied to an anode coupling mode or a plasma producing method having a various type of electrodes other than the parallel plate type electrode. But, in case of the aforementioned helicon wave plasma generation, ECR plasma generation, or ICP plasma generation, it must be configured such that an installing place of the charging electrode depends on a configuration of the apparatus, so that there is no disturbance of the produced plasma and an ion sheath region having a high field intensity is formed. Further, the present invention may be applied to a film forming such as PECVD (Plasma Enhanced CVD), a plasma washing of a substrate to be processed, a plasma cleaning of an inner wall of the chamber, or the like. Still further, the substrate to be plasma processed is not limited to the semiconductor substrate, but a glass substrate, which is used as LCD substrate, PDP substrate, or the like, may be employed.

EFFECTS OF THE INVENTION

As mentioned above, in the present invention, particles generated within a chamber of a plasma processing apparatus are charged positively by positive ions of an ion sheath region, and guided towards a gas exhaust port of the plasma processing apparatus via an object of a negative potential forming the ion sheath region or a space between an inner wall of the chamber and a plasma. In accordance with the present invention, the particles generated within the chamber can be discharged and removed from the chamber with high efficiency. Further, a particle removal apparatus of the present invention can be readily applied to a practical use, since there is no plasma disturbance or metal contamination and a configuration thereof is simple.

What is claimed is:

1. A particle removal apparatus for removing particles from a chamber of a plasma processing apparatus, wherein the chamber has an upper electrode and a lower electrode and is connected to a gas exhaust port and a plasma of a processing gas is generated in the chamber to plasma process a substrate to be processed, the particle removal apparatus comprising:
a particle charging control member for positively charging particles generated within the chamber by positive ions of an ion sheath region formed in a region other than a vicinity of the substrate to be processed, wherein positively charged particles are discharged from the chamber via the gas exhaust port, the particle charging control member includes a control electrode positioned underneath the upper electrode and between the upper electrode and the lower electrode, the upper electrode has a ground potential, and the control electrode is attached to a substantially entire bottom surface of the upper electrode facing the lower electrode.

2. The particle removal apparatus of claim 1, wherein the particle charging control member includes a power supply unit supplying the control electrode with a negative potential.

3. A particle removal apparatus for removing particles from a chamber of a plasma processing apparatus, wherein the chamber has an upper electrode and a lower electrode and is connected to a gas exhaust port and a plasma of a processing gas is generated in the chamber to plasma process a substrate to be processed, the particle removal apparatus comprising:

a particle charging control member for positively charging particles generated within the chamber by positive ions of an ion sheath region formed in a region other than a vicinity of the substrate to be processed; and a charged particle transfer member for transferring positively charged particles towards the gas exhaust port via the ion sheath region, wherein the particle charging control member includes a control electrode positioned underneath the upper electrode and between the upper electrode and the lower electrode, the upper electrode has a ground potential, and the control electrode is attached to a substantially entire bottom surface of the upper electrode facing the lower electrode.

4. The particle removal apparatus of claim 3, wherein the charged particle transfer member includes a control electrode disposed facing the plasma and a power supply unit supplying the control electrode of the charged particle transfer member with a negative potential and the particle charging control member includes a power supply unit supplying the control electrode of the particle charging control member with a negative potential.

5. The particle removal apparatus of claim 2 or 4, wherein the control electrode of the particle charging control member is installed, via an insulating film, on a surface of the upper electrode disposed to face the lower electrode on which the substrate to be processed is mounted.

6. The particle removal apparatus of claim 2 or 4, wherein the control electrode is provided in an inner wall surface of the chamber via an insulating film.

7. The particle removal apparatus of claim 2, wherein the control electrode has a plurality of conductors physically separated from each other, and the power supply unit supplies the conductors independently controlled with independent negative potentials, regarding the particle charging control member.

8. The particle removal apparatus of claim 7, wherein the power supply unit supplies a negative potential with a greater absolute value to a conductor disposed closer to the gas exhaust port.

9. The particle removal apparatus of claim 4, wherein the control electrode of the charged particle transfer member has a plurality of conductors physically separated from each other, and the power supply unit of the charged particle transfer member supplies the conductors independently controlled with independent negative potentials.

10. The particle removal apparatus of claim 7 or 9, wherein the power supply unit of the particle charging control member supplies the conductors with pulses of negative potentials with a phase relationship allowing the positively charged particles to be sequentially transferred towards the gas exhaust port.

11. The particle removal apparatus of claim 9, wherein the power supply unit of the charged particle transfer member supplies a negative potential with a greater absolute value to a conductor disposed closer to the gas exhaust port.

12. The particle removal apparatus of claim 2 or 4, wherein the power supply unit of the particle charging control member has a DC power source electrically connected to the control electrode via a DC circuit.

13. The particle removal apparatus of claim 2 or 4, wherein the power supply unit of the particle charging control member has a high frequency power source electrically connected to the control electrode via capacitance coupling.

14. The particle removal apparatus of claim 2 or 4, wherein a surface of the control electrode of the particle charging control member is coated with an insulating film.

15. The particle removal apparatus of claim 2 or 4, further comprising:

a DC voltage supply applying a DC positive voltage to the substrate.

16. The particle removal apparatus of claim 1 or 3, wherein the plasma processing apparatus has a magnetic field forming member for localizing the plasma produced in the chamber around the substrate to be processed.

17. The particle removal apparatus of claim 1, wherein the control electrode includes openings through which the processing gas passes to enter the chamber.

18. The particle removal apparatus of claim 3, wherein the control electrode includes openings through which the processing gas passes to enter the chamber.

19. A plasma processing apparatus having a chamber connected to a gas exhaust port, wherein a plasma of a processing gas is generated within the chamber to plasma process a substrate to be processed and the chamber has an upper electrode and a lower electrode, the plasma processing apparatus comprising:

a particle charging control member for positively charging particles generated within the chamber by positive ions of an ion sheath region formed in a region other than a vicinity of the substrate to be processed, wherein positively charged particles are discharged from the chamber via the gas exhaust port, the particle charging control member includes a control electrode positioned underneath the upper electrode and between the upper electrode and the lower electrode, the upper electrode has a ground potential, and the control electrode is attached to a substantially entire bottom surface of the upper electrode facing the lower electrode.

20. The plasma processing apparatus of claim 19, wherein the particle charging control member includes a power supply unit supplying the control electrode with a negative potential.

21. The plasma processing apparatus of claim 19, further comprising:

a DC voltage supply applying a DC positive voltage to the substrate.

22. The plasma processing apparatus of claim 19, wherein the control electrode includes openings through which the processing gas passes to enter the chamber.

* * * * *